(12) United States Patent
Kadoguchi et al.

(10) Patent No.: US 8,742,556 B2
(45) Date of Patent: Jun. 3, 2014

(54) SEMICONDUCTOR MODULE

(75) Inventors: Takuya Kadoguchi, Toyota (JP);
Tomomi Okumura, Toyota (JP);
Tatsuya Miyoshi, Nagoya (JP)

(73) Assignee: Toyota Jidosha Kabushiki Kaisha,
Toyota-Shi (JP)

( * ) Notice: Subject to any disclaimer, the term of this patent is extended or adjusted under 35 U.S.C. 154(b) by 0 days.

(21) Appl. No.: 13/349,993

(22) Filed: Jan. 13, 2012

(65) Prior Publication Data

US 2012/0181679 A1     Jul. 19, 2012

(30) Foreign Application Priority Data

Jan. 14, 2011    (JP) .................................. 2011-005961

(51) Int. Cl.
*H01L 23/495* (2006.01)

(52) U.S. Cl.
USPC .......................................... 257/676; 257/678

(58) Field of Classification Search
USPC ................................................ 257/676–714
See application file for complete search history.

(56) References Cited

U.S. PATENT DOCUMENTS

| 6,376,910 B1 | 4/2002 | Munoz et al. |
| 2001/0009301 A1 | 7/2001 | Azuma |
| 2004/0101707 A1 | 5/2004 | Tanaka et al. |
| 2004/0108602 A1 | 6/2004 | Nakajima et al. |
| 2011/0156797 A1* | 6/2011 | Ninomiya et al. ............ 327/482 |

FOREIGN PATENT DOCUMENTS

| CN | 201048129 Y | 4/2008 |
| JP | 52-45368 U | 3/1977 |
| JP | 2003-124406 A | 4/2003 |
| JP | 2004-186622 A | 7/2004 |
| JP | 2005-191178 A | 7/2005 |

OTHER PUBLICATIONS

Office Action issued Jul. 11, 2012 in German Patent Application No. 10 2012 100 137.5 and English translation thereof.

* cited by examiner

*Primary Examiner* — Telly Green
(74) *Attorney, Agent, or Firm* — Kenyon & Kenyon LLP

(57) ABSTRACT

A semiconductor module comprises: a metal block; a semiconductor device installed via a solder layer in a semiconductor device installation area on a surface of the metal block; and a molded portion formed by molding a resin on the metal block and the semiconductor device; wherein the surface of the metal block includes a plating area and a roughened area, and the semiconductor device installation area is provided in the plating area.

7 Claims, 16 Drawing Sheets

FIG.4
(A)
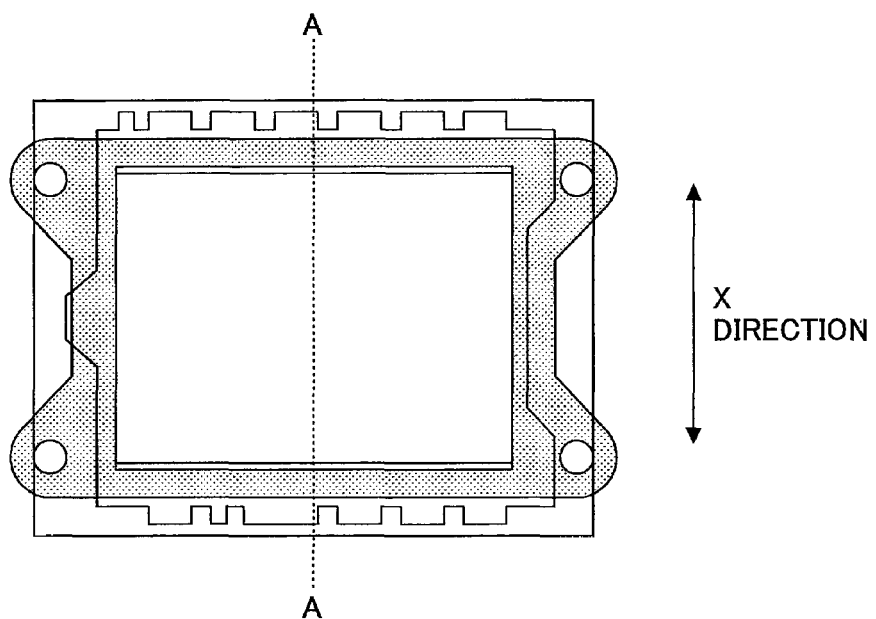
X DIRECTION
(B)
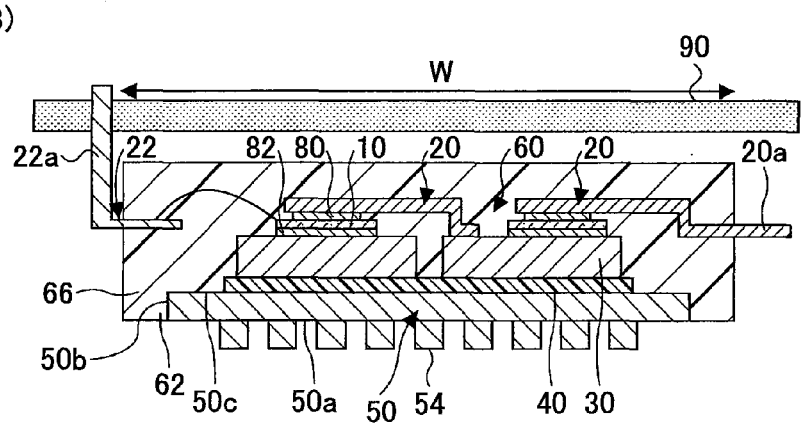

FIG. 8
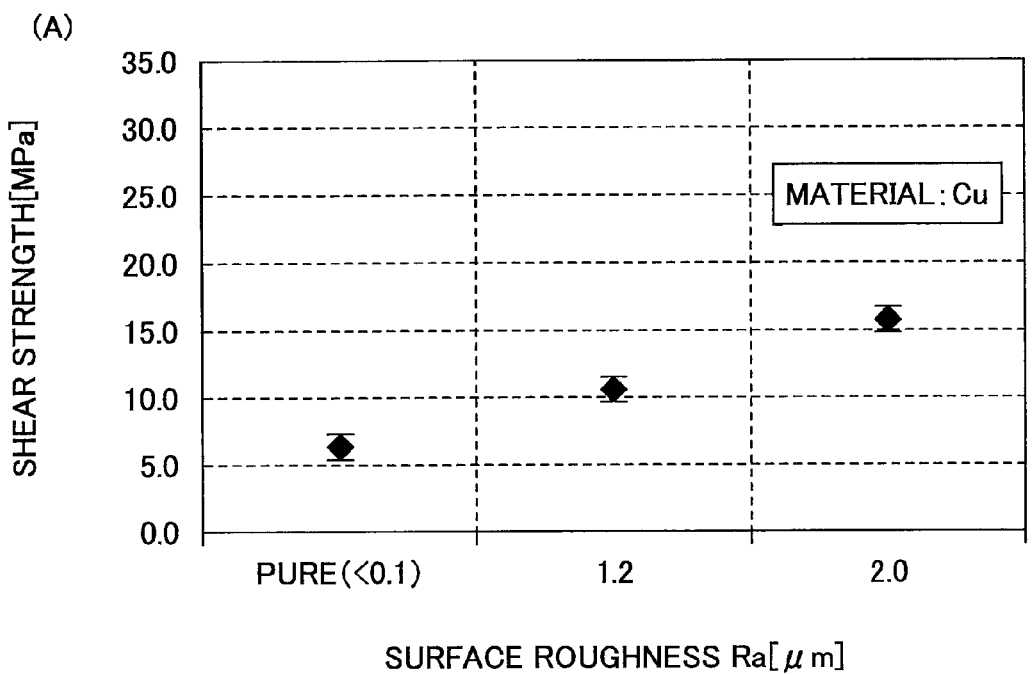
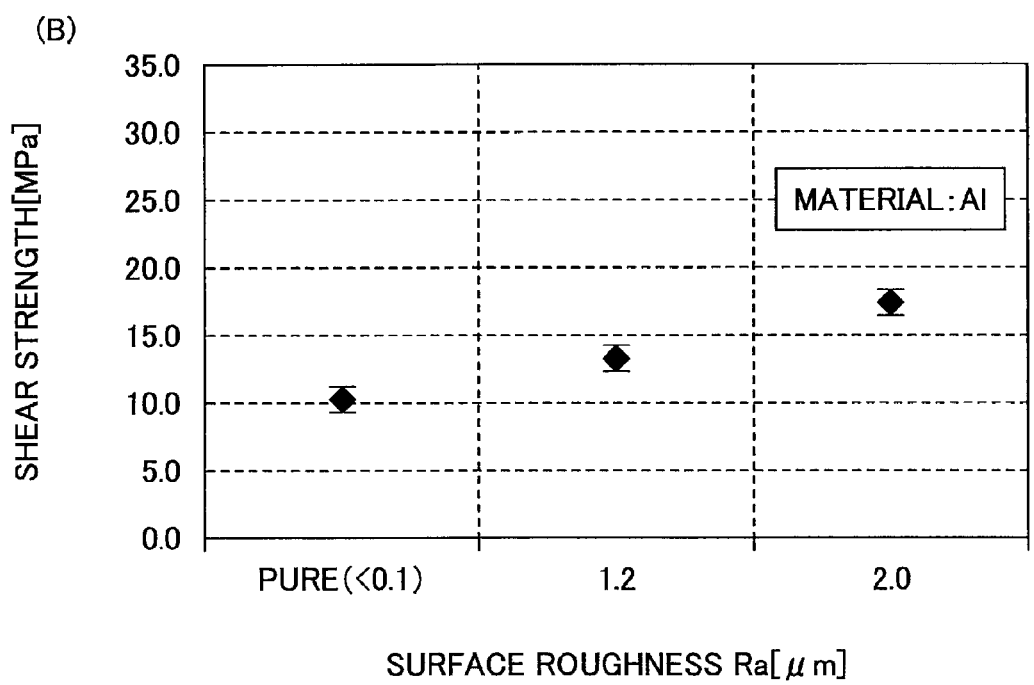

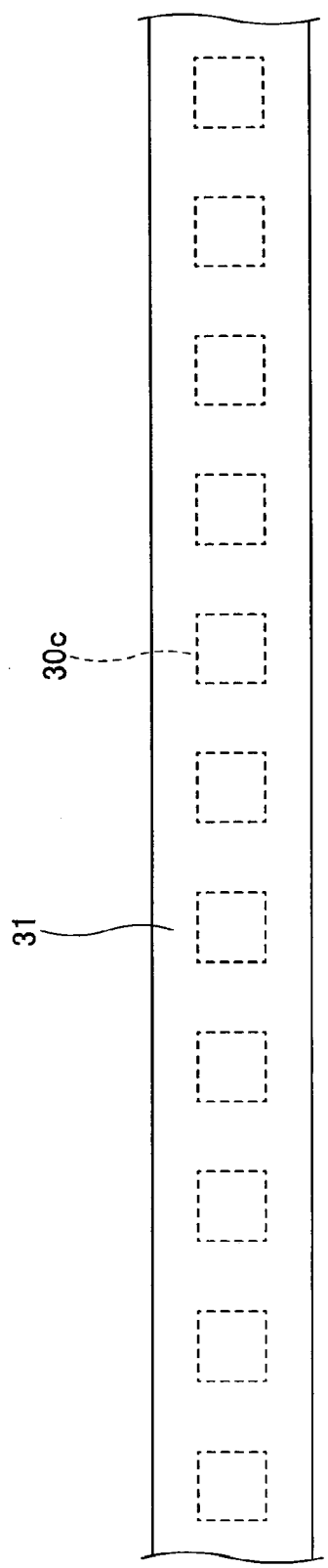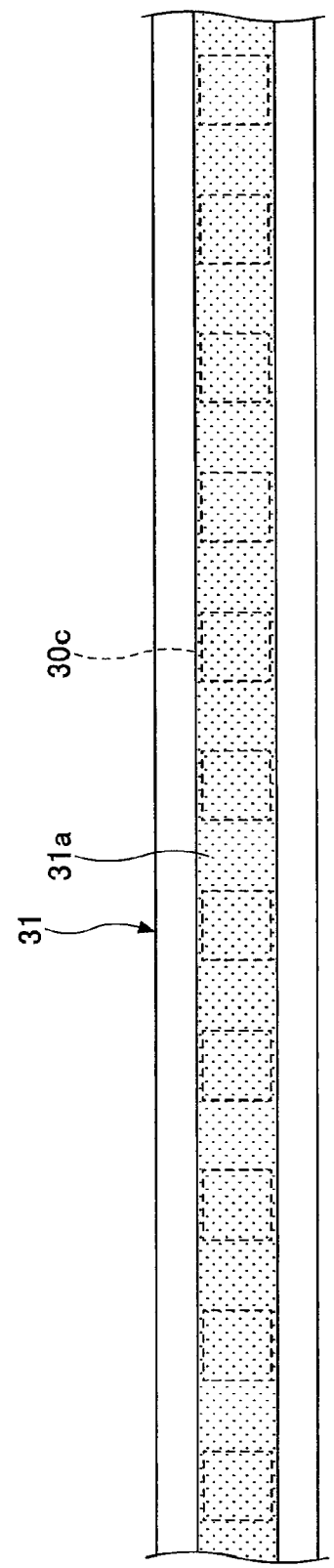

FIG.13
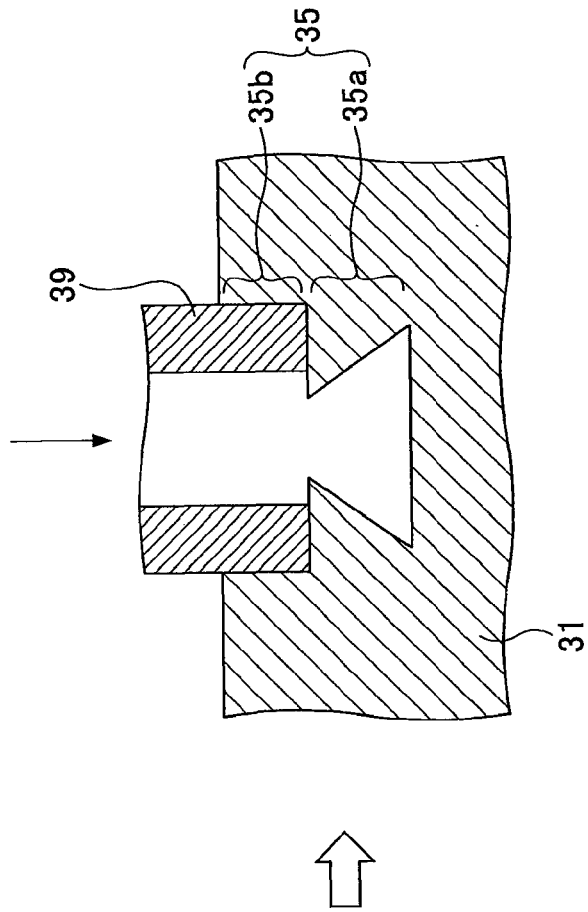
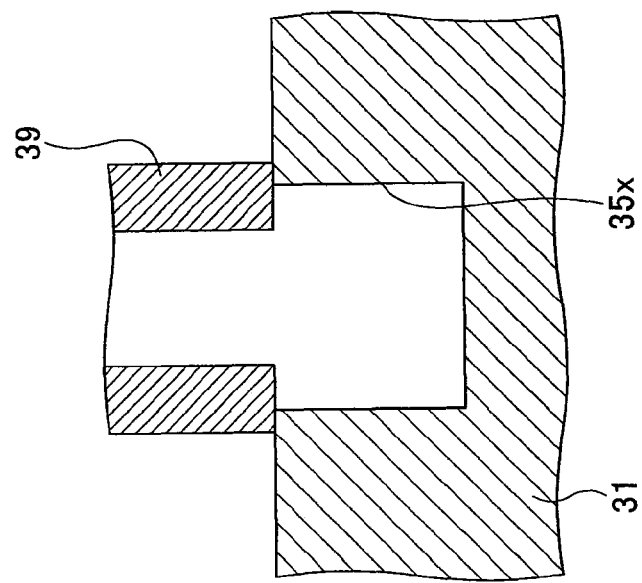

SEMICONDUCTOR MODULE

TECHNICAL FIELD

The present invention relates to a semiconductor module, etc., which includes a molded portion of a resin.

BACKGROUND ART

A semiconductor module in which the semiconductor device is installed via a solder layer on a metal block and a resin is molded to cover the semiconductor device is known.

In such a semiconductor module, as is known from JP2004-186622A, for example, plural of square-shaped concave portions are arranged with a substantially equal distance apart in length and width directions on a portion of a surface of the metal block except for a semiconductor device installation area on which the semiconductor device is installed in order to increase stability in solder thickness directly underneath the semiconductor device as well as degree of adhesion between the metal block and the resin.

However, since the area on which the semiconductor device is installed is not subject to surface treatment such as plating, it is easily oxidized, which leads to such a problem that strict management of temperature and relative humidity or reduction treatment is required to ensure solder wetability. Further, if the metal block is pure Cu, CuSn is formed as an intermetallic compound at the time of soldering, which leads such a problem that Kirkendall voids are generated.

Therefore, in order to solve such problems, it is proposed that the surface of the metal block as a whole be Ni plated, as disclosed in JP2003-124406A, for example.

However, adhesion is not good between the Ni plating and the resin, and thus the resin may be peeled off the metal block. When the resin may be peeled off the metal block, there is such a problem in term of reliability that cracks or the like appear in the solder layer. For this reason, a primer such as an expensive polyamide resin or the like is coated on the area of the metal block on which the resin is to be formed in order to ensure adhesion between the resin and the metal block whose surface as a whole is Ni plated, which leads to an increase in manufacturing cost.

SUMMARY OF INVENTION

The present invention is made in consideration of the matters as described above, and it is an object of the present invention to provide a semiconductor module in which solderability between the metal block and the semiconductor device as well as adhesion between the resin and the metal block are ensured with reduced manufacturing cost, a method of manufacturing the same, etc.

A semiconductor module according to the disclosure comprises: a metal block; a semiconductor device installed via a solder layer in a semiconductor device installation area on a surface of the metal block; and a molded portion formed by molding a resin on the metal block and the semiconductor device; wherein the surface of the metal block includes a plating area and a roughened area, and the semiconductor device installation area is provided in the plating area.

A method of manufacturing a semiconductor module, the semiconductor module comprising a metal block; a semiconductor device installed via a solder layer in a semiconductor device installation area on a surface of the metal block; and a molded portion formed by molding a resin on the metal block and the semiconductor device, the method according to the disclosure comprises: a first process of preparing for a strip-shaped metal material on which plural of the semiconductor device installation areas are aligned in line, and plating a predetermined area on a surface of the metal material to form a plating area including the semiconductor device installation areas; a second process of covering the plating area with a mask; a third process of roughening an area exposed out of the mask on the surface of the metal material to form a roughened area; and a fourth process of cutting and separating the metal material in a direction perpendicular to a longitudinal direction thereof to form metal blocks including at least one semiconductor device installation area.

According to the present invention, a semiconductor module in which solderability between the metal block and the semiconductor device as well as adhesion between the resin and the metal block are ensured with reduced manufacturing cost, method of manufacturing the same, etc., can be obtained.

BRIEF DESCRIPTION OF DRAWINGS

FIG. 4 is a diagram for illustrating an example of a way of connecting a drive circuit 90 to the semiconductor module 1, in which (A) is a perspective drawing from above and (B) is a cross-sectional view along line A-A in (A);

FIG. 8 is a diagram for illustrating examples of a relationship between a surface roughness of a roughened area 30b and a shear strength of the roughened area 30b and the resin molded portion 60, in which (A) corresponds to a case where a material of the metal block 30 is copper and (B) corresponds to a case where a material of the metal block 30 is aluminum;

FIG. 9 is a plan view for illustrating an example of a way of manufacturing the metal block 30 (a first step);

FIG. 10 is a plan view for illustrating an example of a way of manufacturing the metal block 30 (a second step);

FIG. 13 is a plan view for illustrating an example of a way of manufacturing the metal block 30 (a fifth step);

Figure 1:
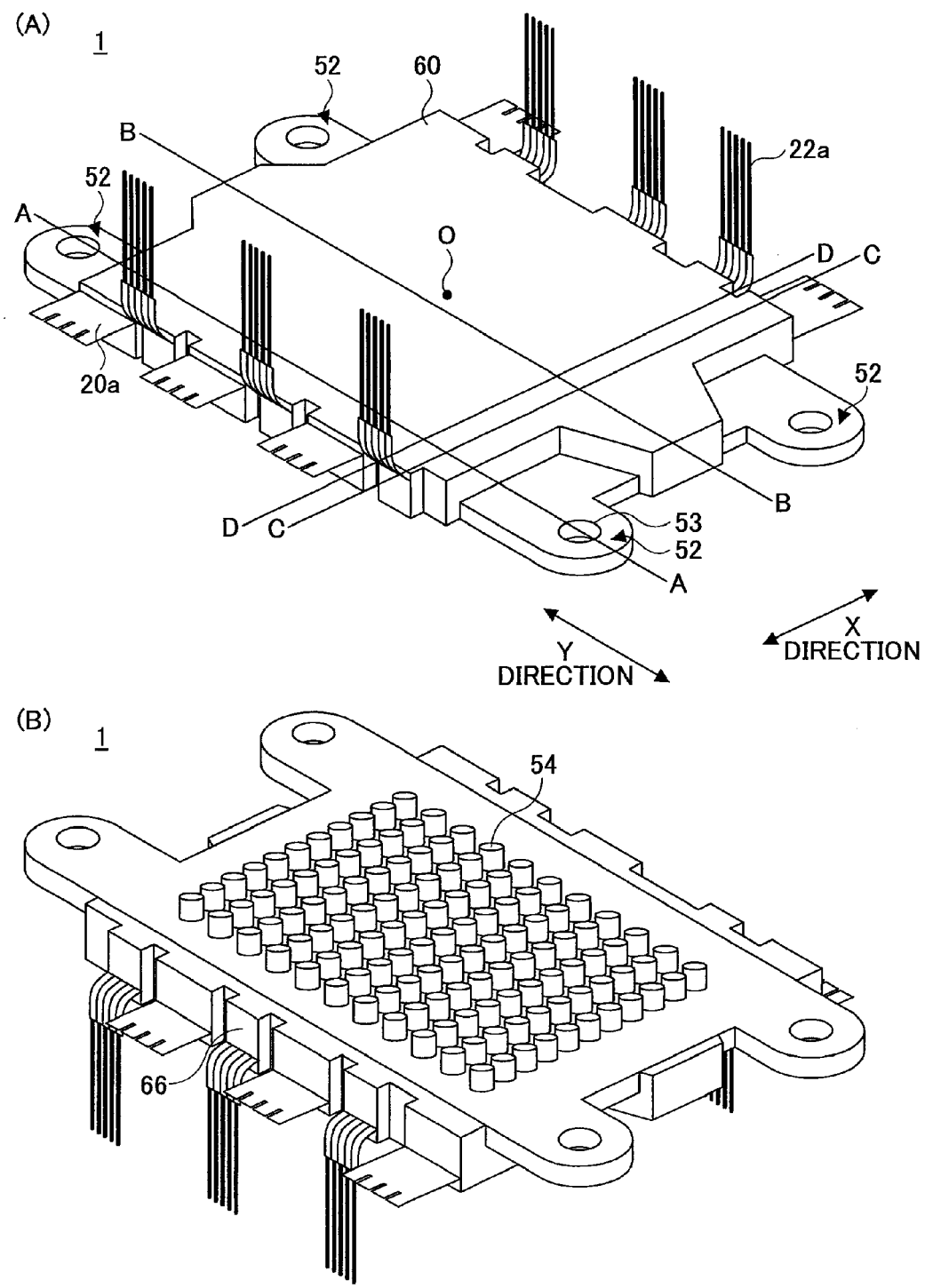
FIG. 1 is a perspective view illustrating an example of an appearance of the semiconductor module 1 according to a first embodiment of the present invention.

EXPLANATION FOR REFERENCE NUMBERS 1 semiconductor module
10 semiconductor device
20 wiring member
20a terminal portion
22 wiring member
20a terminal portion
30, 30A, 30B, 30C metal block
30a, 30d, 31a plating area
30b, 30e, 31b, 32b roughened area
30c semiconductor device installation area
30x cut portion
31 hoop material
32 metal plate
35, 36, 37 concave portion
35a wedge portion
35b rectangular portion
39 die
40 insulating sheet
50 cooling plate
50a lower surface of cooling plate
50b side surface of cooling plate
50c upper surface of cooling plate
51 thin portion
52 mounting portion
53 mounting hole
54 fin
55 seal portion
60 resin molded portion
62 extended side portion
66 rib portion
80 solder layer
82 solder layer
90 drive circuit
100 channel forming member
102 cooling medium channel
106 tapped hole
108 seal portion
109 support surface
110 bolt
120 sealing member
600 hybrid system
602 battery
610 inverter
612 IPM
616 DC-DC booster transformer
620, 622 motor generator

BEST MODE FOR CARRYING OUT THE INVENTION

In the following, the best mode for carrying out the present invention will be described in detail by referring to the accompanying drawings.

First Embodiment

Figure 2:
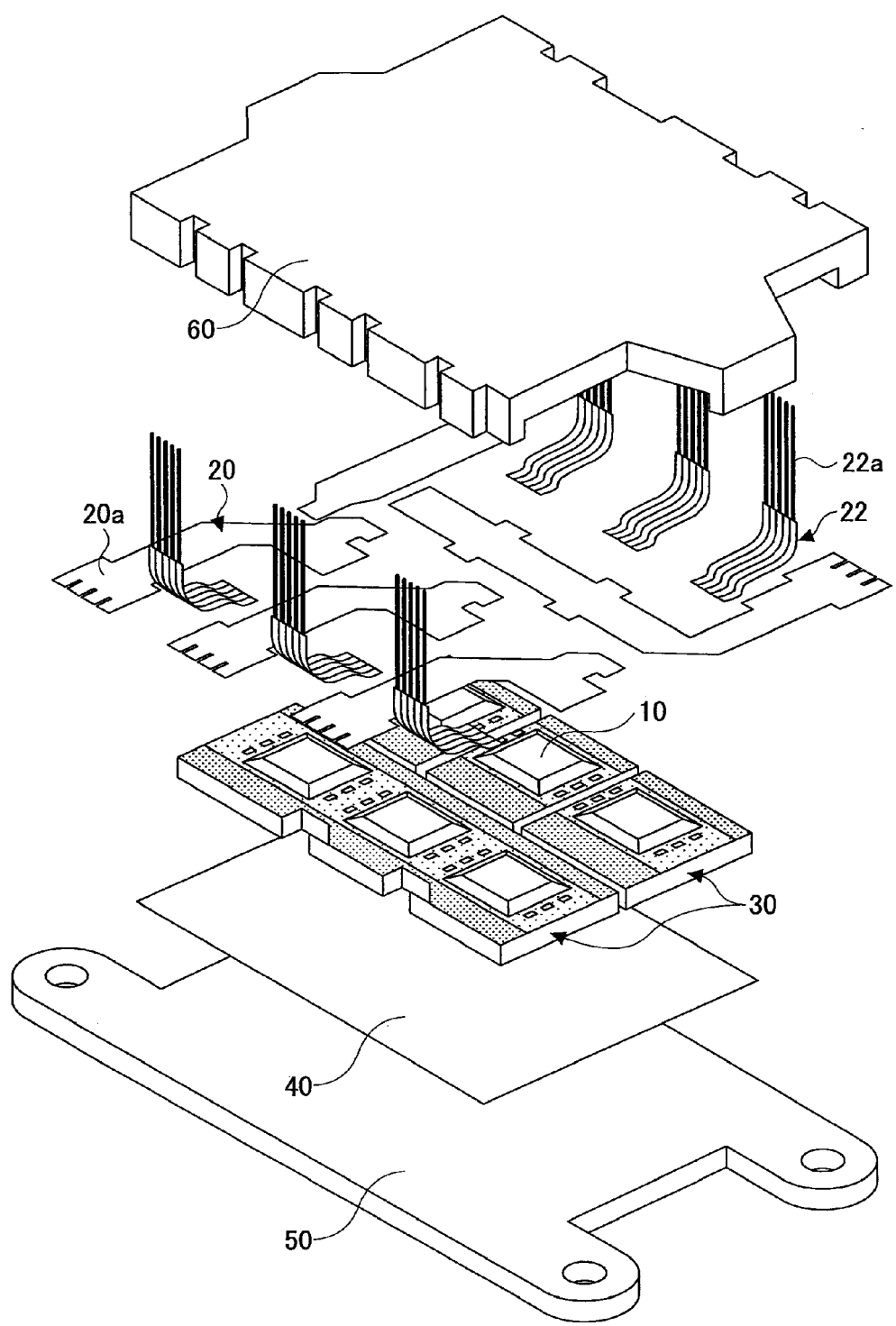
FIG. 2 is a perspective view of an example of main parts of the semiconductor module 1 in FIG. 1 which are exploded for the sake of convenience.

FIG. 1 is a perspective view illustrating an example of an appearance of the semiconductor module 1 according to a first embodiment of the present invention, where (A) is a perspective view from an upper side and (B) is a perspective view from a lower side. It is noted that up and down directions are different depending on the installed status; however, hereinafter a cooling plate side of the semiconductor module 1 is assumed to be a lower side for the sake of convenience. Further, as terminology, "center side" or "central side" is used with reference to a center O of the semiconductor module 1 (see FIG. 1 (A)). It is noted that the center O may be rough and does not have a nature which is determined precisely. FIG. 2 is a perspective view of an example of main parts of the semiconductor module 1 in FIG. 1 which are exploded for the sake of convenience.

In the illustrated example, the semiconductor module 1 is a part of an inverter for driving a motor used in a hybrid vehicle or an electric vehicle.

Figure 3:
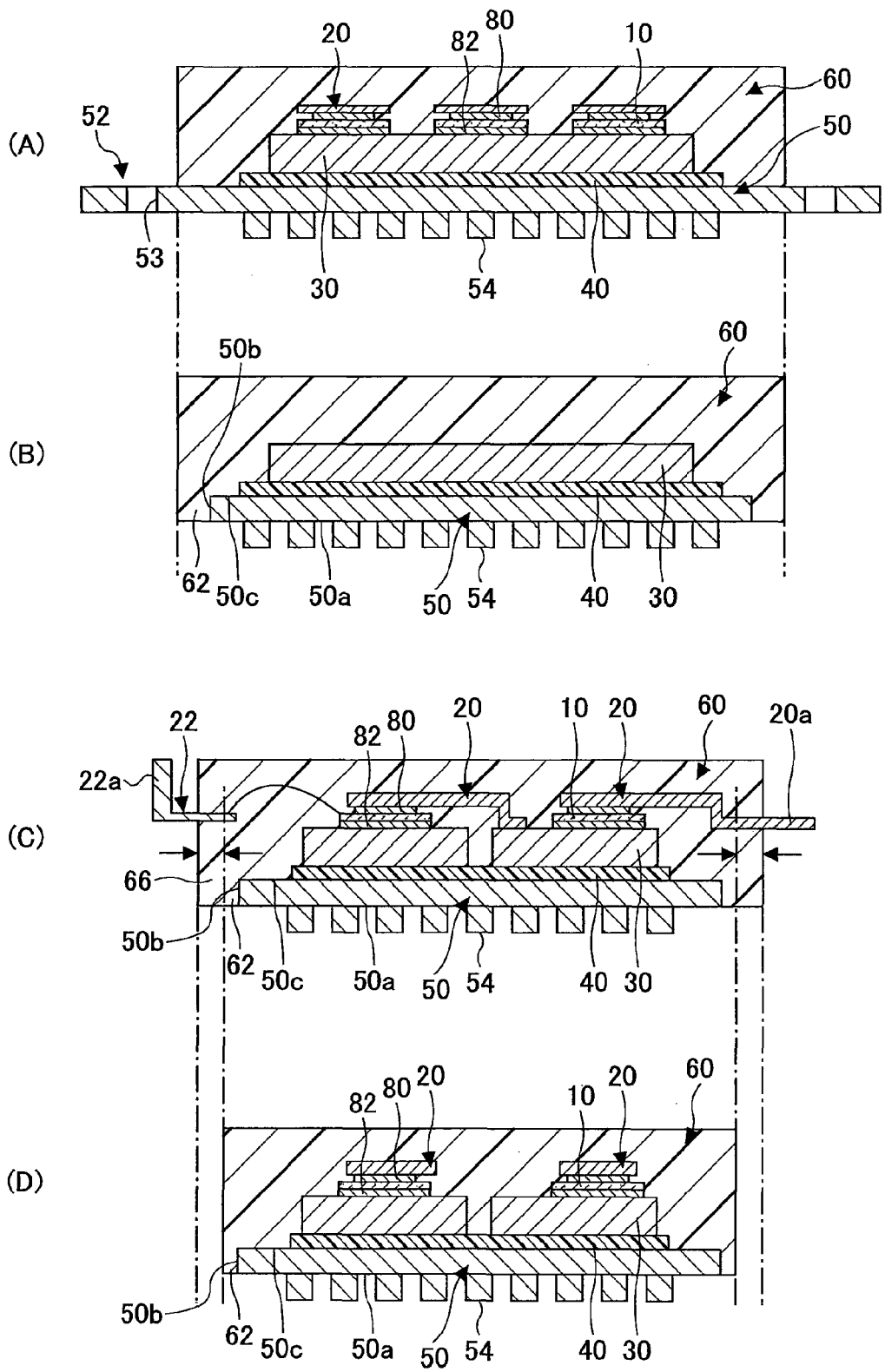
FIG. 3 is a cross-sectional view of the semiconductor module 1 in FIG. 1 along the respective lines.

FIG. 3 is a cross-sectional view of the semiconductor module 1 in FIG. 1 along the respective lines, where (A) is a cross-sectional view along line A-A, (B) is a cross-sectional view along line B-B, (C) is a cross-sectional view along line C-C and (D) is a cross-sectional view along line D-D.

The semiconductor module 1 includes, as main components, semiconductor devices 10, wiring members 20, 22, metal blocks 30, an insulating sheet 40, a cooling plate 50 and a resin molded portion 60.

The semiconductor devices 10 include a power semiconductor device. For example, the semiconductor devices 10 may include a switching device such as an IGBT (Insulated Gate Bipolar Transistor) and a MOSFET (metal oxide semiconductor field-effect transistor). It is noted that in the illustrated example, the semiconductor module 1 is a part of the inverter, and the semiconductor devices 10 may be IGBTs and diodes which define respective upper arms and lower arms of a U-phase, a V-phase and a W-phase arranged in parallel between a positive side line and a negative side line.

The wiring members 20, 22 are constructed by forming a metal plate (a lead frame substrate). In the illustrated example, the wiring members 20 are wiring members used for a power supply line (i.e., leads for a power supply line). Further, the wiring members 22 are pin-shaped wiring members used for a signal transmission (i.e., leads for a signal transmission). The wiring members 20 may be connected to the corresponding terminals of the semiconductor devices 10 by soldering, etc. In the illustrated example, the wiring members 20 are connected to the corresponding terminals of the semiconductor devices 10 via solder layers 80. Further, the wiring members 22 may be connected to the corresponding terminals of the semiconductor devices 10 by wire bonding (aluminum wires), etc. For example, with respect to IGBTs, some of the wiring members 20 are connected to collectors of the IGBTs via the metal blocks 30. Further, some of the wiring members 20 are connected to emitters of the IGBTs. Further, some of the wiring members 22 are connected to gates of the IGBTs.

The metal blocks 30 have a heat sink function of absorbing heat such as transient heat and spreading it. The metal blocks 30 may be formed of any material other than a metal material as long as they have a heat sink function; however, preferably the metal blocks 30 are formed of a metal material which has good thermal diffusivity, such as copper, alloys of copper and aluminum. On upper surfaces of the metal blocks 30 are disposed the semiconductor devices 10 by soldering, etc. In the illustrated example, the semiconductor devices 10 are installed on the upper surfaces of the metal blocks 30 via solder layers 82. The metal blocks 30 mainly absorb the heat generated in the semiconductor devices 10 during the operations of the semiconductor devices 10 and diffuse the heat toward their insides. It is noted that the metal blocks 30 are described separately in detail.

The insulating sheet 40 is formed of a resin sheet, for example. The insulating sheet 40 enables high thermal conductivity from the metal blocks 30 to the cooling plate 50 while ensuring electrical insulation between the metal blocks 30 and the cooling plate 50. The insulating sheet 40 has an outer shape which is larger than a lower surface of the metal blocks, as shown in FIG. 3, etc.

It is noted that, preferably, the insulating sheet 40 bonds to the metal blocks 30 and the cooling plate 50 directly without using solder, metal films or the like. With this arrangement, it is possible to reduce thermal resistance and simplify a process in comparison with the case of using the solder. Further, the surface treatment on the cooling plate 50 suited for soldering becomes unnecessary. For example, the insulating sheet 40 is made of the same resin material (epoxy resin, for example) as the resin molded portion described hereinafter, and bonds to the metal blocks 30 and the cooling plate 50 under a pressure and at a temperature at the time of molding the resin molded portion 60 described hereinafter.

The cooling plate 50 is formed of a material which has good thermal diffusivity. For example, the cooling plate 50 may be formed of a metal such as aluminum. The cooling plate 50 has fins 54 on a lower surface thereof. The number of the fins 54 and an arrangement manner of the fins 54 are arbitrary unless otherwise specified. Further, a configuration of fins 54, such as a shape, height, etc., is arbitrary. The fins 54 may be straight fins or pin-shaped fins arranged in a staggered arrangement or the like. In an installed status of the semiconductor module 1 the fins 54 come into contact with a cooling medium such as cooling water or cooling air. In this way, the heat generated in the semiconductor devices 10 during the operations of the semiconductor devices 10 is transferred to the cooling medium from the fins 54 of the cooling plate 50 via the metal blocks, the insulating sheet 40 and the cooling plate 50.

It is noted that the fins 54 may be integrally formed with the cooling plate 50 (aluminum die-casting, for example) or may be integrated with the cooling plate 50 by welding or the like.

The cooling plate 50 includes mounting portions 52 on the opposite sides thereof in a direction (Y direction in FIG. 1, in this example). The respective mounting portions 52 provide bolt seating surfaces in which mounting holes 53 through which bolts are tighten are formed. The cooling plate may be fastened to a channel forming member (a water channel, a housing, etc.) which defines a cooling medium channel through which the cooling medium is circulated (see FIG. 14).

The mounting portions 52 of the cooling plate 50 may be formed in areas at the ends of the cooling plate 50, which areas project in the Y direction with respect to their neighboring areas. Specifically, in the example shown in FIG. 1, the mounting portions 52 are formed at two locations on each end, and the two mounting portions 52 on each end are formed in areas, which areas are located on the opposite sides in an X direction and project in a Y direction with respect to a middle area therebetween. It is noted that the mounting portions 52 of the cooling plate 50 are integrally formed with the cooling plate 50 by pressing, for example; however, the mounting portions 52 may be formed separately and fixed to the cooling plate 50 by welding or the like.

The resin molded portion 60 is formed by molding a resin on the semiconductor devices 10, the wiring members 20, 22, the metal blocks 30, the insulating sheet 40 and the cooling plate 50, as shown in FIG. 3, etc. Specifically, the resin molded portion 60 is a portion for sealing therein the main components (the semiconductor devices 10, the wiring members 20, 22, the metal blocks 30 and the insulating sheet 40) with respect to the upper surface of the cooling plate 50. It is noted that the resin used may be epoxy resin, for example. However, with respect to the wiring members 20, 22, terminal portions 20a, 22a for connecting to peripheral devices and appurtenant portions thereof required for extending the terminal portions 20a, 22a to predetermined positions (terminal portions 20a, 22a including appurtenant portions thereof are referred to as merely "terminal portions 20a, 22a") are exposed out of the resin molded portion 60. Further, the mounting portions 52 of the cooling plate 50 are exposed out of the resin molded portion 60. Specifically, in the cooling plate 50 the mounting portions 52 are set outwardly (in the Y direction) with respect to an area adhered to the resin molded portion 60. It is noted that the terminal portions 20a, 22a of the wiring members 20, may be changed to their final shapes by lead cutting and forming after the resin molded portion 60 is molded.

Here, according to the embodiment, as shown in FIG. 1, FIG. 3 (A), (C), etc., the terminal portions 20a, 22a of the wiring members 20, 22 are exposed out of the resin molded portion 60 to extend in the X direction while the mounting portions 52 of the cooling plate 50 are exposed out of the resin molded portion 60 to extend in the Y direction. Specifically, the terminal portions 20a, 22a of the wiring members 20, 22 and the mounting portions 52 of the cooling plate 50 are exposed out of the resin molded portion 60 in the perpendicular directions. In other word, the terminal portions 20a, 22a of the wiring members 20, 22 are exposed out of the resin molded portion 60 at the opposite sides of the semiconductor module 1 in the X direction while the mounting portions 52 of the cooling plate 50 are exposed out of the resin molded portion 60 at the opposite sides of the semiconductor module 1 in the Y direction.

According to the configuration, since the terminal portions 20a, 22a of the wiring members 20, 22 don't extend above the mounting portions 52 (the mounting holes 53, in particular) of the cooling plate 50 viewed in a vertical direction, it is possible to bolt the mounting portions 52 of the cooling plate 50 to the channel forming member (a water channel, a housing, etc.) 100 described hereinafter (see FIG. 14) directly above the mounting portions 52. Therefore, workability of bolting is improved and useless space can be eliminated. Further, as shown in FIG. 4, when the terminal portions (signal terminal portions) 22a of the wiring members 22 are connected to a drive circuit 90, the opposite ends of the drive circuit 90 in the X direction are opposed to an existence area (a signal terminal area) of the terminal portions 22a of the wiring members 22 in a vertical direction. Thus, degree of freedom for a layout is increased in utilizing a central portion of the drive circuit 90 which corresponds to an area indicted by symbol W. For example, it becomes easy to separate a high-voltage circuit block from a low-voltage circuit block within the drive circuit 90.

It is noted that the direction in which the terminal portions 20a, 22a of the wiring members 20, 22 extend may be substantially perpendicular to the direction in which the mounting portions 52 of the cooling plate 50 extend, and thus the angle may be shifted from 90 degrees as long as the effect described above is not substantially affected. Further, the direction in which the terminal portions 20a, 22a of the wiring members 20, 22 extend and the direction in which the mounting portions 52 of the cooling plate 50 extend are not necessarily substantially perpendicular to the side surface of the resin molded portion 60. Further, the terminal portions 20a, 22a of the wiring members 20, 22 may include portions thereof bent in a vertical direction or a Y direction after being exposed out of the resin molded portion 60. In general, the terminal portions 20a, 22a of the wiring members 20, 22 may be located on the sides of the resin molded portion 60 which are different from the sides of the resin molded portion 60 out of which the mounting portions 52 are exposed.

The resin molded portion 60 preferably includes, in its side portion region from which the terminal portions 20a, 22a of the wiring members 20, are exposed, rib portions 66 which project outwardly with respect to their neighboring side portion region, as shown in contrast in (C) and (D) in FIG. 3. The rib portions 66 extend in a vertical direction with respect to the wiring members 20, 22 near the portions from which the wiring members 20, 22 are exposed. In other words, the rib portions 66 are provided such that they cover root portions of the terminal portions 20a, 22a of the wiring members 20, (i.e., root portions with respect to the resin molded portion 60). The rib portions 66 are provided only for the side portion region from which the terminal portions 20a, 22a of the wiring members 20, are exposed. Thus, as shown in (B) in FIG. 1, concave portions are formed between the rib portions 66 in the side portion of the resin molded portion 60, and thus the side portion of the resin molded portion 60 have projections and depressions as a whole. With this arrangement, a creepage distance between the neighboring terminal portions 20a, 22a of the wiring members 20, 22 in the Y direction can be increased in the side portion of the resin molded portion 60.

Further, preferably, the rib portions 66 are provided not only for the exposed portions of the wiring members 20, 22 in a vertical direction but are provided over a long distance in a height direction of the side portion of the resin molded portion 60, as shown in (C) in FIG. 3. With this arrangement, the strength and rigidity in the end of the resin molded portion 60 can be increased. For example, with respect to the lower side, the rib portions 66 may extend to the upper surface 50c of the cooling plate 50, or may extend to an plane which is coplanar with the lower surface 50a of the cooling plate 50, as shown in (C) in FIG. 3. Further, with respect to the upper side, the rib portions 66 may extend beyond the terminal portions 20a, 22a of the wiring members 20, 22. For example, the rib portions 66 may extend to such a height that they forms an upper surface of the resin molded portion 60, as shown in (C) in FIG. 3.

The resin molded portion 60 substantially adheres to the substantially overall wiring members 20, (except for the exposed portions of the terminal portions 20a, 22a and surface portions coupled to the semiconductor devices 10); upper surfaces (except for mounting portions for the wiring members 20, 22) and side surfaces of the semiconductor devices 10; an upper surface (except for mounting portions for the semiconductor devices 10, etc.) and a side surface of the metal block 30; an upper surface (except for mounting portions for the metal block 30) and a side surface of the insulating sheet 40; and an upper surface of the cooling plate 50, as shown in (C) in FIG. 3.

Further, the resin molded portion 60 preferably includes extended portions 62 which extend such that they are coplanar with the lower surface 50a of the cooling plate 50 to adhere to the side surface 50b of the cooling plate 50, as shown in (C) in FIG. 3. With this arrangement, adhesion of the resin molded portion 60 to the side surface 50b of the cooling plate 50 in addition to the upper surface 50c of the cooling plate 50 is implemented, which efficiently increases adhesion between the resin molded portion 60 and the cooling plate 50. Further, it is possible to prevent the resin molded portion 60 from being peeled off from the cooling plate 50 due to curling of the resin molded portion 60, etc. Further, it is possible to omit a surface treatment (roughening, primer coating) in the portions of the cooling plate 50 to which the resin molded portion 60 is adhered. However, such a surface treatment may be performed if necessary.

It is noted that with respect to the up-down direction, the extended portions 62 may extend, from above the side surface 50b of the cooling plate 50, to the plane which is coplanar with the lower surface 50a of the cooling plate 50. In the example shown in (B) in FIG. 3, the extended portions 62 are provided over the overall side portion of the resin molded portion 60 in a vertical direction, as is the case with the rib portions 66. It is noted that, in the illustrated example, with respect to regions where the rib portions 66 are provided, the extended portions 62 are integral with the rib portions 66 and are defined inside of the rib portions 66 (i.e., on a side opposed to the center of the resin molded portion 60), as shown in (D) in FIG. 3.

Preferably, the extended portions 62 are provided over a large area of the side surface 50b of the cooling plate 50 so as to increase adhesion. For example, in the illustrated example, in the ends of the cooling plate 50 in the Y direction, the extended portions 62 are provided over the overall side surface 50b of the cooling plate 50 except for the locations of the mounting portions 52. In other words, in the opposite ends of the cooling plate 50 in the Y direction, the extended portions 62 are provided on the side surface 50b of the cooling plate 50 between two mounting portions 52 in the X direction. Further, in the opposite ends of the cooling plate 50 in the X direction, the extended portions 62 are provided on the side surface 50b of the cooling plate 50 along the length of the cooling plate 50 in the Y direction. Further, in the opposite ends of the cooling plate 50 in the X direction, the extended portions 62 are provided over the overall side surface 50b of the cooling plate 50. With respect to this arrangement, since the extended portions 62 are provided over the substantially overall side surface 50b of the cooling plate 50 except for the locations of the mounting portions 52 of the cooling plate 50, it is possible to effectively increase adhesion between the cooling plate 50 and the resin molded portion 60.

Figure 5:
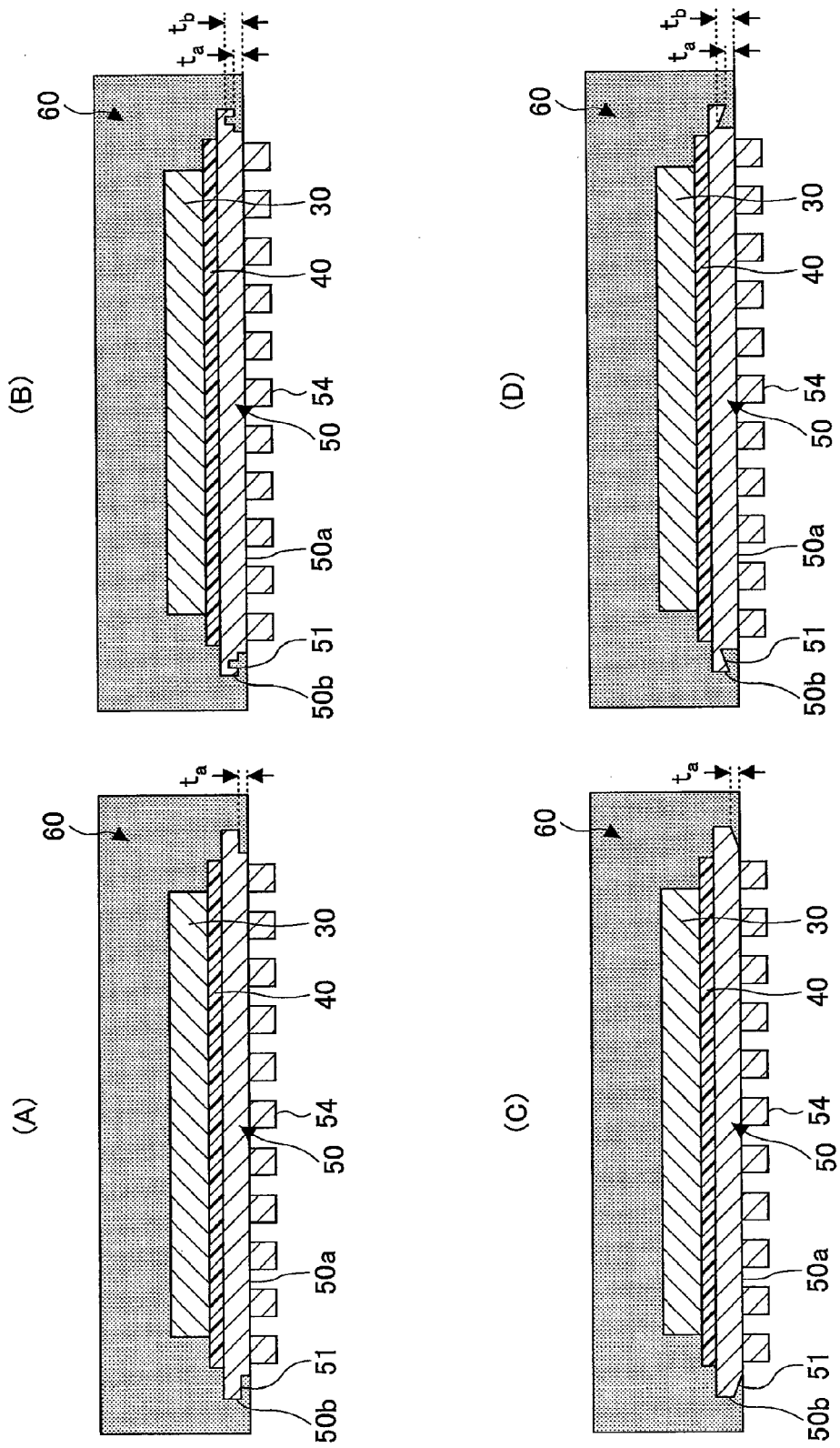
FIG. 5 is a diagram for illustrating preferred examples of adhered manner between extended side portions 62 of a resin molded portion 60 and a side surface 50b of a cooling plate 50.

FIG. 5 is a diagram for illustrating preferred examples of adhered manner between the extended side portions 62 of the resin molded portion 60 and the side surface 50b of the cooling plate 50. It is noted that hatching for the resin molded portion is different from that in other drawings for visibility. It is noted that FIG. 5 shows a cross-sectional view corresponding to (B) in FIG. 3.

Thin portions 51 may be formed in the lower surface 50c of the cooling plate 50 so as to further increase adhesion between the side surface 50b of the cooling plate 50 and the extended side portions 62 of the resin molded portion 60, as shown in FIG. 5. The thin portions 51 are formed on the side opposed to the side surface 50b in the lower surface 50c of the cooling plate 50. In other words, the thin portions 51 are formed by thinning the lower surface 50c of the cooling plate 50 at the ends of the cooling plate 50. The extended side portions 62 of the resin molded portion 60 cover the lower surface 50c of the cooling plate 50 at the thin portions 51 thereof. Regions of the extended side portions 62, which cover the lower surface 50c of the cooling plate 50 at the thin portions 51, have thickness set such that they are substantially coplanar with the lower surface 50c of the cooling plate 50 on the center side.

The thin portions 51 are provided for a region in the side surface 50b on which the extended side portions 62 are provided. In other words, the thin portions 51 are provided for the side surface 50b of the cooling plate 50 except for the locations of the mounting portions 52 of the cooling plate 50 where the extended side portions 62 don't exist. Preferably, the thin portions 51 are provided for the substantially overall side surface 50b of the cooling plate 50 except for the locations of the mounting portions 52 of the cooling plate 50, as is the case with the extended side portions 62. The thin portions may be formed by any methods such as etching, pressing, machining, and a shape of a die for die casting, etc.

Specifically, according to the example in (A) in FIG. 5, the thin portions 51 are formed by reducing a constant thickness to from the lower surface 50a at the end of the cooling plate 50.

According to the example in (B) in FIG. 5, the thin portions 51 are formed by reducing a varied thickness from the lower surface 50a at the end of the cooling plate 50. The thickness to be reduced varies from a first thickness ta to the thickness ta via a second thickness tb which is greater than ta, when viewed from the edge of the end of the cooling plate to the center side. It is noted that in an alternative embodiment, the thickness to be reduced may vary from a first thickness ta to a third thickness (which is thinner than a thickness of the cooling plate 50 and greater than or equal to 0) via a second thickness tb which is greater than ta.

According to the example in (C) in FIG. 5, the thin portions 51 are formed by reducing a varied thickness from the lower surface 50a at the end of the cooling plate 50. The thickness to be reduced varies gradually from the first thickness ta to 0 when viewed from the edge of the end of the cooling plate 50 to the center side. It is noted that in an alternative embodiment, the thickness to be reduced may gradually vary from the first thickness ta to a fourth thickness (which is thinner than the first thickness ta and greater than or equal to 0).

According to the example in (D) in FIG. 5, the thin portions 51 are formed by reducing a varied thickness from the lower surface 50a at the end of the cooling plate 50. The thickness to be reduced varies gradually from the first thickness ta to the second thickness tb which is greater than ta, when viewed from the edge of the end of the cooling plate 50 to the center side.

In the examples shown in FIG. 5, since the extended side portions 62 of the resin molded portion 60 extend to the side of the lower surface 50a of the cooling plate 50 at the thin portions 51 (i.e., the extended side portions 62 cover the thin portions 51 from the lower side), the extended side portions 62 can adhere to the ends of the cooling plate 50 such that they encompass the ends of the cooling plate 50 from upper and lower sides, which increases adhesion between the resin molded portion 60 and the cooling plate 50. It is noted that the examples in FIG. 5 are just representative examples. Further, the examples in FIG. 5 may be combined in any manner. The thin portions 51 may have any shape, as long as the extended side portions 62 can extend from the side surface 50b to the lower surface 50a of the cooling plate 50 such that they are coplanar with the lower surface 50a of the cooling plate 50 on the center side.

Figure 6:
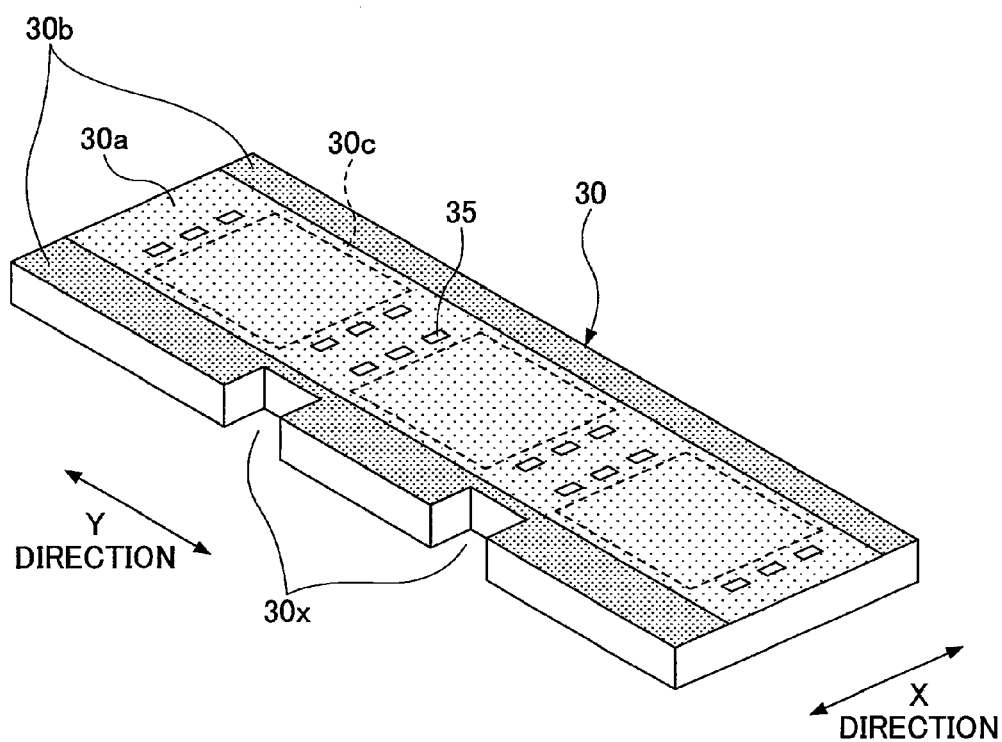
FIG. 6 is a perspective view for illustrating an example of a status in which semiconductor devices 10 are not installed on a metal block 30.

Next, the metal block 30 is described in detail with reference to FIG. 6. FIG. 6 is a perspective view for illustrating an example of a status in which the semiconductor devices 10 are not installed on the metal block 30. As shown in FIG. 6, the upper surface of the metal block 30 is divided to a plating area 30a and roughened areas 30b. The plating area 30a is formed in a strip form extending in the Y direction such that it includes semiconductor device installation areas 30c which are located near the center in the upper surface of the metal block 30.

It is noted that the strip form is a generic name for a shape in which the length in a certain direction is longer than the length in another direction in the same plane. Thus, the concrete shape of the plating area 30a is not limited to a rectangular shape, etc. For example, the shape of the plating area 30a may be such that its width is varied such that a part in a longitudinal direction is smaller, may be curved, or may be configured in a wave form or a serrated form (i.e., triangle-waves form). Alternatively, these shapes may be combined in any ways.

Further, in FIG. 6, the plating area 30a is formed in a strip form along a longitudinal direction of the metal block 30 such that it includes semiconductor device installation areas 30c; however, the plating area 30a may be formed in a strip form along a direction perpendicular to a longitudinal direction such that it includes semiconductor device installation areas 30c. For example, the latter case may be applied when only one semiconductor device installation area 30c is disposed on the metal block 30. In this way, the plating area 30a is formed on the metal block 30 such that it includes the semiconductor device installation areas 30c.

The semiconductor device installation areas 30c are not lines formed in advance on the upper surface of the metal block 30 but areas on which the semiconductor devices 10 are planned to be installed via the solder layers 82. The roughened areas 30b are formed in a strip form in the Y direction on the opposite sides of the plating area 30a such that they sandwich the plating area 30a. Cut portions 30x are formed on a certain side of the metal block 30. However, the cut portions 30x are used for registration, etc., and thus may be omitted.

The plating area 30a may be an area in the upper surface of the metal block 30 onto which nickel plating is carried out. However, plating is not limited to nickel plating. For example, plating which provides good solder wetability and higher resistance to oxidizing in comparison with copper, such as silver plating, gold plating, tin plating, palladium plating, etc., may be used. Further, several plating layers may be stacked on the plating area 30a. For example, such a configuration in which a nickel plating layer is formed on the upper surface of the metal block 30 and a gold plating layer is formed on the nickel plating layer, a configuration in which a nickel plating layer is formed on the upper surface of the metal block 30 and a palladium plating layer and a gold plating layer are formed in this order on the nickel plating layer, etc., may be used.

The reason why the plating area 30a is provided is to ensure the solder wetability required to install the semiconductor devices 10 via the solder layers 82. As described above, if the semiconductor device installation areas 30c are not subject to surface treatment such as plating, they are easily oxidized, which leads to the problem that strict management of temperature and relative humidity or reduction treatment is required to ensure solder wetability. In particular, in the case of the metal block 30 formed of pure copper, there are problems that a compound CuSn is formed when the semiconductor devices 10 are installed via the solder layers 82, Kirkendall voids are generated, etc.

According to the present embodiment, the plating area 30a is provided on the upper surface of the metal block 30, and the semiconductor device installation areas 30c are set in the plating area 30a. With this arrangement, it is possible to ensure solder wetability required to install the semiconductor devices 10 on the upper surface of the metal block 30 via the solder layers 82. Further, although NiSn is formed as an intermetallic compound at the time of installing the semiconductor devices 10 via the solder layers 82, Kirkendall voids are prevented because the NiSn spreads slowly.

Figure 7:
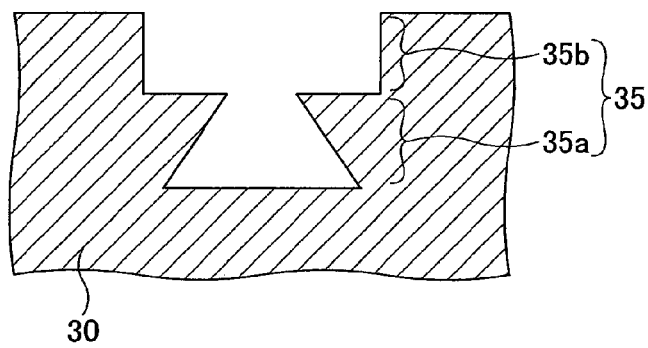
FIG. 7 is an enlarged cross-sectional view of an example of a concave portion 35.

Concave portions 35, which have openings with a substantially rectangular shape in a plan view, are formed in areas in the plating area 30a except for the semiconductor device installation areas 30c. The concave portions 35 are formed and positioned a specified distance apart in the areas in the plating area 30a except for the semiconductor device installation areas 30c. FIG. 7 is an enlarged cross-sectional view of an example of the concave portion 35. As shown in FIG. 7, the concave portion 35 has such a cross section that a wedge portion 35a is formed at the bottom and a rectangular portion 35b, which is in communication with the wedge portion 35a, is formed above the wedge portion 35a. It is noted that the wedge portion 35a is formed such that the area at the connection point with the rectangular portion 35b is smaller than the area at the bottom (i.e., a reversed tapered shape). The size of the opening of the concave portion 35 (in a plan view) may be between 0.2 mm and 0.5 mm. Further, the depths of the wedge portion 35a and the rectangular portion 35b may be between 0.2 mm and 0.5 mm, for example.

The reason why the concave portions 35 are formed in the areas in the plating area 30a except for the semiconductor device installation areas 30c is to ensure adhesion between the metal blocks 30 and the resin molded portion 60. When the resin molded portion 60 is formed such that it covers the semiconductor devices 10, the wiring members 20, 22 and the metal blocks 30, resin material forming the resin molded portion 60, such as epoxy resin, is supplied and set in the concave portions 35. Thus, even if thermal stress is generated in such a direction that it peels off the resin molded portion 60 at an interface with the metal block 30 at the time of an operation of the semiconductor devices 10, etc., the resin filling in the wedge portions 35a of the concave portions 35 is not pulled out. Thus, it is possible to avoid peeling off the resin molded portion 60 at an interface with the plating area 30a of the metal block 30, and thus ensure adhesion between the plating area 30a of the metal block 30 and the resin molded portion 60.

It is noted that, as described above, according to prior art, a primer such as an expensive polyamide resin or the like is coated on the area of the metal block on which the resin is to be formed, because adhesion between the resin and the nickel plating is not good. According to the present embodiment, since the concave portions 35 are formed in the areas in the plating area 30a except for the semiconductor device installation areas 30c, it is possible to ensure sufficient adhesion between the metal blocks 30 and the resin molded portion 60 without coating the primer such as an expensive polyamide resin or the like. As a result, it is possible to reduce manufacturing cost of the metal block 30.

It is noted that three concave portions 35 provided in the X direction may be connected to each other. In other words, a concave portion whose longitudinal direction corresponds to the X direction may be formed to obtain the same effect (increased adhesion).

The roughened area 30b is an area on the upper surface of the metal block 30 in which numerous microscopic asperities are formed. In order to form the roughened area 30b in the upper surface of the metal block 30, such a way (i.e., so-called rough plating) can be used, for example, in which an area other than an area to be the roughened area 30b is masked and plating is performed with high current density in a copper plating solution using the metal block 30 as a negative pole. In this way, projected electro-deposited components of copper are formed to define the roughened area 30b in the upper surface of the metal block 30.

It is noted that instead of the so-called rough plating method, the roughened area 30b may be formed by carrying out surface treatment of a predetermined area in the upper surface of the metal block 30 with etchant which mainly includes formic acid, for example, to form the microscopic asperities (i.e., so-called etching and roughing). Further, the roughened area 30b may be formed by spraying abrasive material such as alumina grain with high pressure to the predetermined area in the upper surface of the metal block 30 to form the microscopic asperities (i.e., so-called abrasive blasting).

The reason why the roughened area 30b is provided on the upper surface of the metal block 30 is to ensure adhesion between the metal block 30 and the resin molded portion 60. In other words, when the resin molded portion 60 is formed such that it covers the semiconductor devices 10, the wiring members 20, 22 and the metal blocks 30, resin material forming the resin molded portion 60, such as epoxy resin, is formed on the microscopic asperities in the roughened areas 30b, which produces an anchor effect and ensures adhesion between the roughened areas 30b of the metal blocks 30 and the resin molded portion 60. It is noted that preferably the microscopic asperities in the roughened area 30b have surface roughness Ra between 1 μm and 2 μm.

FIG. 8 is a diagram for illustrating examples of a relationship between a surface roughness of the roughened area 30b and a shear strength of the roughened area 30b and the resin molded portion 60. In FIG. 8, (A) corresponds to a case where a material of the metal block 30 is copper and (B) corresponds to a case where a material of the metal block 30 is aluminum. As shown in (A) and (B) in FIG. 8, in either case where a material of the metal block 30 is copper or where a material of the metal block 30 is aluminum, by implementing surface roughness Ra of the roughened area 30b between 1 μm and 2 μm, the shear strength is increased with respect to a pure material (Ra<0.1 μm). In other words, by setting the surface roughness Ra of the roughened area 30b between 1 μm and 2 μm, it is possible to increase adhesion between the roughened area 30b of the metal block 30 and the resin molded portion 60. It is noted that the adhesion between the roughened area 30b of the metal block 30 and the resin molded portion 60 is related not only to the surface roughness of the roughened area 30b but also to the surface area of the roughened area 30b, and thus the increased surface area increases the adhesion even when the surface roughness is the same.

Next, a way of manufacturing the metal block is described. FIGS. 9-13 are plan views for illustrating the way of manufacturing the metal block 30. First, in a process shown in FIG. 9, a hoop material 31 is prepared (in FIG. 9, only a part of the hoop material 31 is shown). The hoop material 31 is a strip-shaped metal material which is finally separated into the metal blocks 30, and has the semiconductor device installation areas 30c aligned in line in advance. However, the semiconductor device installation areas 30c are not lines formed in advance on the upper surface of the hoop material 31 but areas on which the semiconductor devices 10 are planned to be installed via the solder layers 82.

The hoop material 31 may be formed of copper, copper alloy, aluminum, etc., for example. The length of the hoop material 31 may be several tens meters, for example. The width of the hoop material 31 may be set appropriately according to a desired width of the completed metal block 30. The width of hoop material 31 may be between 20 mm and 50 mm, for example. The thickness of hoop material 31 may be set appropriately according to a desired thickness of the completed metal block 30. The thickness of the hoop material 31 may be between 1 mm and 10 mm, for example.

Next, in a process shown in FIG. 10, plating of the upper surface of the hoop material 31 is carried out to form a plating area 31a. The plating area 31a is formed in a strip form along the Y direction near the center in the upper surface of the hoop material 31. The plating area 31a is an area which becomes the plating area 30a when the metal block 30 is finally formed via separation.

Specifically, the upper surface of the hoop material 31 is covered with a mask (not shown) such that the strip-shaped area in the upper surface of the hoop material 31, in which the semiconductor device installation areas 30c are arranged, is exposed. In order to cover with a mask, for example, a resist material may be coated; however, it is preferred to apply a masking tape (a strip-shaped material) whose width corresponds to the width of the area to be masked. This is because workability is good and positional accuracy of the application is increased, which enables reduction in manufacturing cost. Then, the plating area 31a is formed by carrying out the nickel plating onto the area exposed out of the mask in the upper surface of the hoop material 31, by electroless plating, for example. The thickness of the plating area 31a may be between 4 µm and 10 µm, for example. Then, the mask is removed. It is noted that in the process shown in FIG. 10, the material described above may be used instead of the nickel plating.

Figure 11:
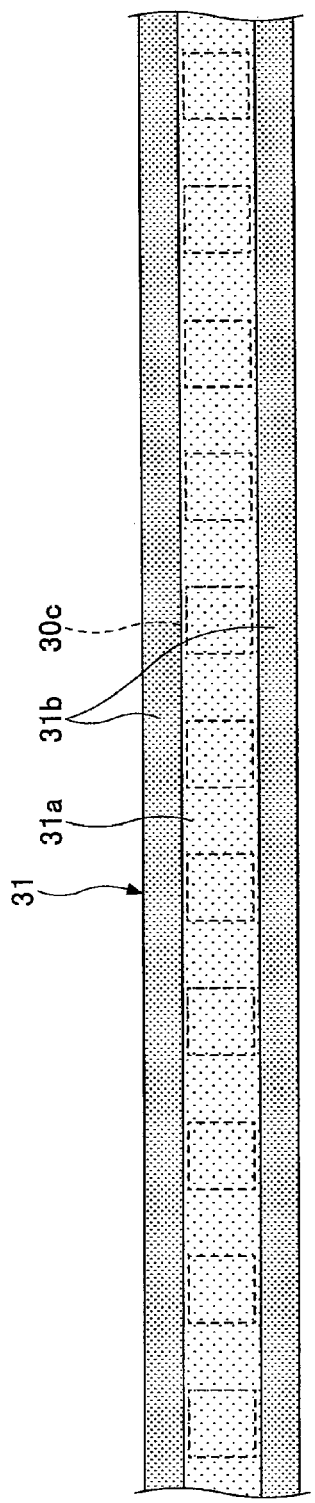
FIG. 11 is a plan view for illustrating an example of a way of manufacturing the metal block 30 (a third step)

Then, in a process shown in FIG. 11, the area of the upper surface of the hoop material 31 except for the plating area 31a is roughened to form roughened areas 31b. The roughened areas 31b are formed in a strip form in the Y direction on the opposite sides of the plating area 31a such that they sandwich the plating area 31a. The roughened areas 31b are areas which becomes the roughened areas 30b when the metal block 30 is finally formed via separation.

Specifically, the plating area 31a in the upper surface of the hoop material 31 is covered with a mask (not shown). In order to cover with a mask, for example, a resist material may be coated; however, it is preferred to apply a masking tape (a strip-shaped material) whose width corresponds to the width of the area to be masked. This is because workability is good and positional accuracy of the application is increased, which enables reduction in manufacturing cost. Then, the roughened areas 31b with numerous microscopic asperities are formed by carrying out the rough plating, etching and roughing, abrasive blasting, etc., for example, to the area exposed out of the mask in the upper surface of the hoop material 31. The surface roughness Ra of the roughened area 31b may be between 1 µm and 2 µm, for example. Then, the mask is removed.

Figure 12:
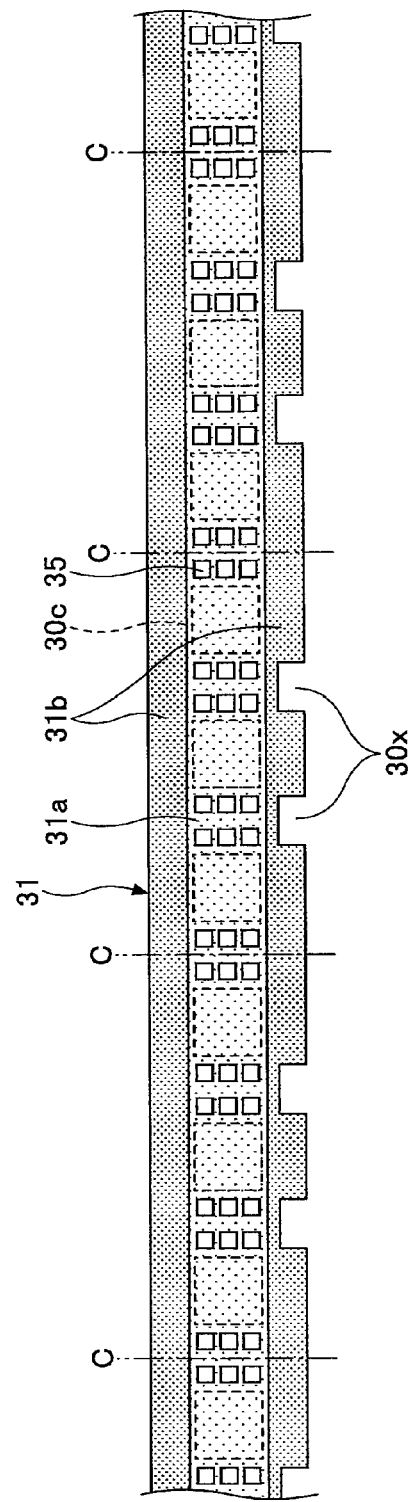
FIG. 12 is a plan view for illustrating an example of a way of manufacturing the metal block 30 (a fourth step)

Then, in a process shown in FIG. 12, the concave portions 35 are formed in an area of the plating area 31a except for the semiconductor device installation areas 30c. The concave portion 35 is configured such that the wedge portion 35a is formed at the bottom and the rectangular portion 35b, which is in communication with the wedge portion 35a, is formed above the wedge portion 35a. Further, the cut portions 30x are formed in one of the roughened areas 31b of the hoop material 31 by press working. It is noted that symbol C indicates cutting positions for finally cutting the hoop material 31. It is noted that the cutting positions C are not lines formed in advance on the upper surface but positions along which cutting of the hoop material 31 is carried out.

The concave portions 35, which have the wedge portion 35a and the rectangular portion 35b, are formed by carrying out a first press working for forming concave parts 35x and then carrying out a second press working using a die 39 to the midpoints of the concave portions 35, as shown in FIG. 13. Then, a structure shown in FIG. 12 is separated by cutting it along cutting positions C (in a direction perpendicular to the longitudinal direction) by press working. In this way, the metal block 30 such as shown in FIG. 6 is completed. For example, a progressive die may be used in manufacturing the metal block 30.

It is noted that after the process shown in FIG. 11, the concave portions 35 or the cut portions 30x may be formed after cutting the structure shown in FIG. 12 along the cutting positions C by press working.

Accordingly, by providing the plating area 30a in a part of the upper surface of the metal block 30 and providing the semiconductor device installation areas 30c in the plating area 30a, it is possible to ensure the solder wetability required to install the semiconductor devices 10 via the solder layers 82. Further, although NiSn is formed as an intermetallic compound at the time of installing the semiconductor devices 10 via the solder layers 82, Kirkendall voids are prevented because the NiSn spreads slowly.

Although adhesion between the resin and the nickel plating or the like is not good, it is possible to ensure adhesion between the plating area 30a of the metal block 30 and the resin molded portion 60 because the concave portions 35 are formed in the area in the plating area 30a except for the semiconductor device installation areas 30c.

Further, an anchor effect is produced because the roughened areas 30b are formed in the area in the upper surface of the metal block 30 except for the plating area 30a. Thus, it is possible to ensure adhesion between the roughened area 30b of the metal block 30 and the resin molded portion 60.

Further, workability of masking process and positional accuracy are increased by forming the metal blocks 30 from the hoop material 31. Thus, it is possible to reduce a cost in manufacturing the metal blocks 30.

It is noted that in FIG. 6 three semiconductor device installation areas 30c are provided in the upper surface of the metal block 30; however, the number of the semiconductor device installation areas 30c provided in the upper surface of the metal block 30 may be 1, 2, 4 or more than 4.

Figure 14:
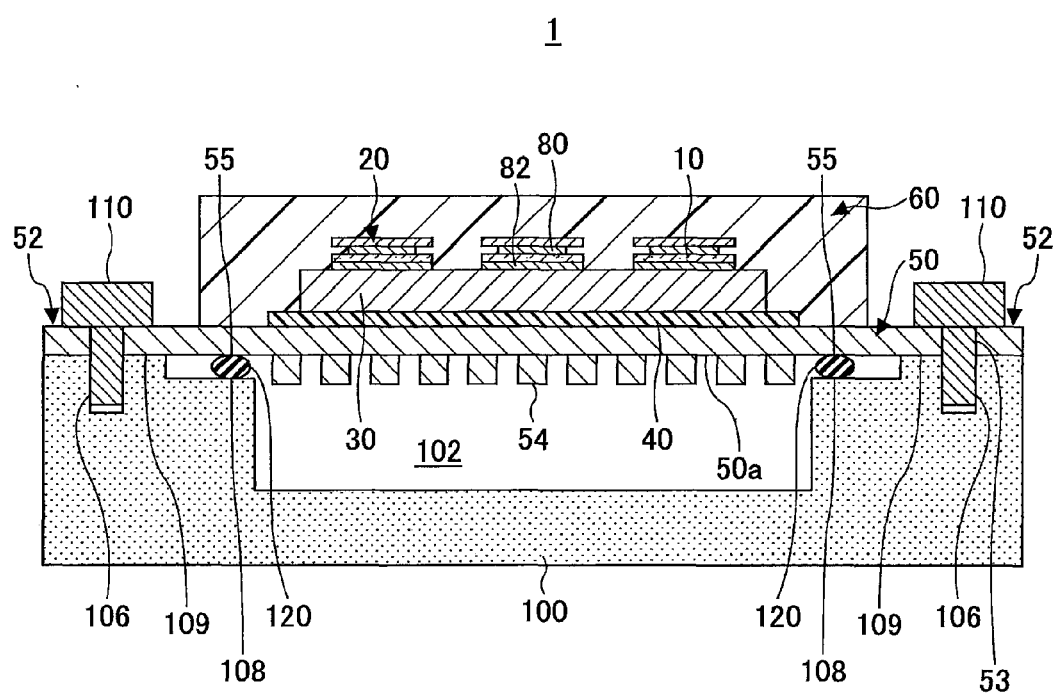
FIG. 14 is a cross-sectional view of an example of an installed status of the semiconductor module 1.

FIG. 14 is a cross-sectional view of an example of an installed status of the semiconductor module 1. In FIG. 14, the installed status of the semiconductor module 1 is shown in a cross-sectional view (corresponding to (A) in FIG. 3) along a line A-A in FIG. 1.

The semiconductor module 1 is bolted to a channel forming member (a water channel, a housing, etc.) 100 which forms a cooling medium channel 102 through which a cooling medium (water in this example) is circulated, as shown in FIG. 14. Specifically, the semiconductor module 1 is coupled to the channel forming member 100 by means of bolts 110 in such an orientation that the side of the lower surface 50a of the cooling plate 50, that is to say, the side of the fins 54 faces the cooling medium channel 102. For this reason, in the channel forming member 100 tapped holes 106 are formed at positions corresponding to fastening positions of the bolts 110 (i.e., positions of the mounting holes 53 of the mounting portions 52 of the cooling plate 50). The bolts 110 are bolted into the corresponding tapped holes 106 of the channel forming member 100 via the corresponding mounting holes 53 of the cooling plate 50. It is noted that the cooling medium channel 102 is defined by the channel forming member 100 in cooperation with the lower surface 50a of the cooling plate 50, as shown in FIG. 14.

Further, between the lower surface 50a of the cooling plate 50 and the channel forming member 100, a sealing member 120 is provided to seal between the lower surface 50a of the cooling plate 50 and the channel forming member 100. In other words, the sealing member 120 is provided between a seal portion 108 of the channel forming member 100 and a seal portion 55 of the lower surface 50a of the cooling plate 50 such that it prevents leakage of the cooling medium from the cooling medium channel 102 of the channel forming member 100. The seal portion 55 of the lower surface 50a of the cooling plate 50 may be provided over the overall periphery of the outer peripheral portion of the cooling plate 50. However, another sealing member may be provided for the outlet or inlet of the cooling medium channel 102, if necessary. Similarly, the seal portion 108 of the channel forming member 100 is provided such that it is opposed to the seal portion 55 of the lower surface 50a of the cooling plate 50. Preferably, the seal portion 55 and the seal portion 108 are set outwardly with respect to the side portion of the metal blocks 30 and are set on the center side with respect to the side portion of the resin molded portion 60. With this arrangement, it is possible to efficiently ensure the sealing area and downsize the semiconductor module 1 in the Y direction. Further, it is possible to prevent the resin molded portion 60 from being subjected to the cooling medium such as water. Further, it is possible to provide space between the fastening positions of the bolts 110 (i.e., the mounting portions 52) and the sealing area (the seal portion 55), because the seal portion 55 is located on the center side with respect to the fastening positions of the bolts 110 (i.e., the mounting portions 52).

In the illustrated example, the seal portion 108 is formed in a step which is set downwardly from a support surface 109 for supporting the mounting portions 52 of the cooling plate 50. The sealing member 120 is disposed and elastically compressed in a space created by the step between the seal portion 55 of the lower surface 50a of the cooling plate 50 and the seal portion 108. Typically, the sealing member 120 is a rubber packing whose cross section is substantially circular, for example. However, the sealing member 120 may be formed of any material with any cross section as long as it implements sealing between the seal portion 55 and the seal portion 108. The sealing member 120 may have a shape or an outline corresponding to the seal portion 55 and the seal portion 108. The sealing member 120 may have a ring-like shape corresponding to the outer peripheral portion of the cooling plate 50 if the seal portion 55 and the seal portion 108 are provided over the overall periphery of the outer peripheral portion of the cooling plate 50. It is noted that a relationship (such as a clearance) between the seal portion 55 and the seal portion 108 may be any as long as it implements necessary sealing between the seal portion 55 and the seal portion 108 in cooperation with the sealing member 120.

Second Embodiment

In the second embodiment, a metal block 30A is shown in which roughened areas, which are different from those of the metal block 30 according to the first embodiment, are provided. It is noted that in the second embodiment an explanation for the components which are the same as those in the previously described embodiment is omitted.

Figure 15:
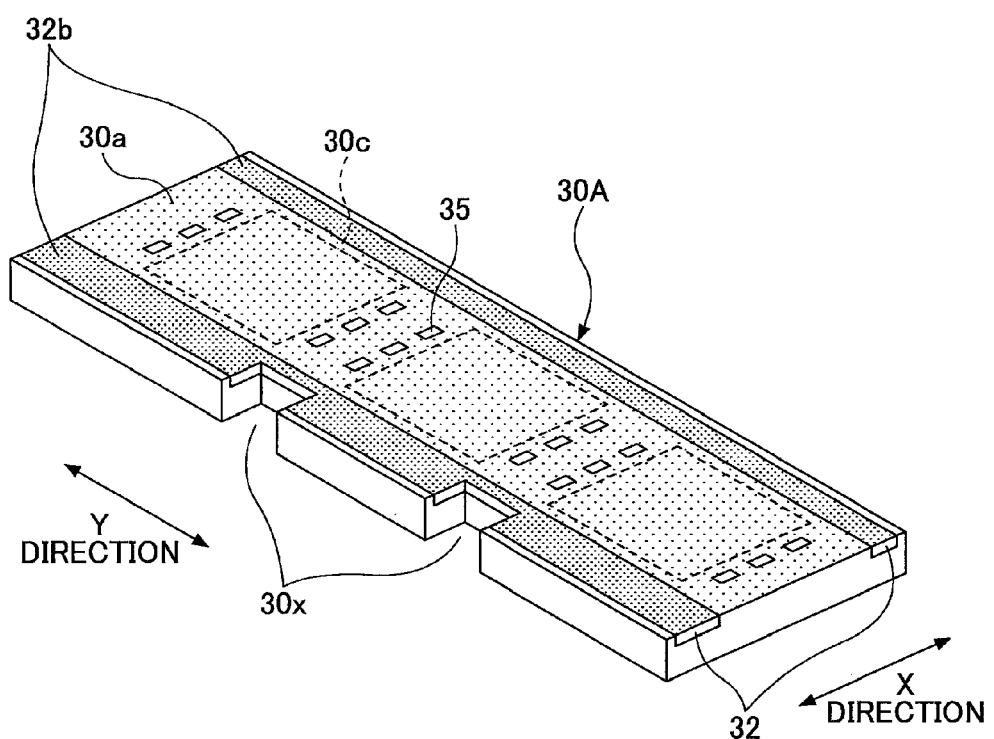
FIG. 15 is a perspective view for illustrating an example of a status in which the semiconductor devices 10 are not installed on a metal block 30A.

FIG. 15 is a perspective view for illustrating an example of a status in which the semiconductor devices 10 are not installed on the metal block 30A. As shown in FIG. 15, the upper surface of the metal block 30A is divided into a plating area 30a and roughened areas 32b. Concave portions which are strip-shaped in the Y direction are provided on the opposite sides of the plating area 30a of the metal block 30A. Metal plates 32 are press-fitted in the concave portions. The upper surfaces of the metal plates 32 are roughened to define the roughened areas 32b. Cut portions 30x are formed on a certain side of the metal block 30A. However, the cut portions 30x are used for registration, etc., and thus may be omitted.

The metal plates 32 are formed of a material which is different from a material of a body of the metal block 30A (except for a portion of the metal plates 32). In other words, if the material of the body of metal block 30A is copper, for example, the material of the metal plates 32 may be a material other than copper, such as iron, aluminum, SUS (stainless steel mainly formed of Cr and Ni), silver or an alloy thereof, for example. The thickness of the metal plate 32 may be 0.1 to 4 mm, for example.

In this way, the upper surface of the metal block 30A includes the upper surfaces of the metal plates 32 which are press-fitted in the portions of the metal block 30A and formed of a material different from that of the metal block 30A, the upper surfaces of the metal plates 32 are roughened to define the roughened areas 32b, and the upper surface of the metal block 30A except for the upper surfaces of the metal plates 32 are made to be the plating area 30a.

It is noted that since the metal plates 32 are provided only in the portions of the body of the metal block 30A, any material selected for the metal plates 32 does not affect a heat radiation capability of the metal block 30A. Thus, since the material of the metal plates 32 can be selected freely without taking the heat radiation capability (coefficient of thermal conductivity, etc.) into account, a material of the metal plates 32, which is congenial to the resin, is preferably selected.

In order to manufacture the metal block 30A, at first the strip-shaped concave portions are formed in a winding direction (i.e., a longitudinal direction) of the hoop material 31 in preparing for the hoop material 31 as is the case with the process shown in FIG. 9. Then, the metal plates 32 are press-fitted into the formed strip-shaped concave portions, and thus the upper surfaces of the metal plates 32 are exposed in the portions of the upper surface of the hoop material 31.

Next, as is the case with the process shown in FIG. 10, plating of the upper surface of the hoop material 31 is carried out to form a plating area 31a. In this case, preferably, the material of the metal plates 32 may be selected from materials on which the plating, which is used for forming the plating area 31a, cannot be formed. In this case, it is possible to eliminate the process describe in connection with the first embodiment. Specifically, it is possible to eliminate the process in which the upper surface of the hoop material 31 is covered with a mask (not shown) such that the strip-shaped area in the upper surface of the hoop material 31, in which the semiconductor device installation areas 30c are arranged, is exposed. In other words, even without being covered with a mask (not shown), only the area of the upper surface of the hoop material 31 except for the upper surface of the metal plates 32 is selectively plated and thus the plating area 30a is formed. As a result, it is possible to reduce a manufacturing cost of the metal block 30A.

Then, the processes such as shown in FIGS. 11-13 are carried out to complete the metal block 30A.

In this way, according to the second embodiment, the plating area 30a is formed near the center of the upper surface of the metal block 30A and the semiconductor device installation areas 30c are provided in the plating area 30a. The concave portions 35, which have openings with a substantially rectangular shape in a plan view, are formed in areas in the plating area 30a except for the semiconductor device installation areas 30c. Further, the metal plates 32 are press-fitted on the opposite sides of the plating area 30a such that they sandwich the plating area 30a and the upper surfaces of the metal plates 32 are roughened. With this arrangement, the following effects as well as the same effects as those in the first embodiment are obtained. By selecting the material of the metal plates 32 from materials on which the plating, which is used for forming the plating area 31a, cannot be formed, it is possible to selectively plate only a desired portion without using a mask in forming the plating area 30a, which can reduce the manufacturing cost of the metal block 30A.

Further, since the metal plates 32 are provided only in the portions of the body of the metal block 30A, any material selected for the metal plates 32 does not affect a heat radiation capability of the metal block 30A. As a result, since the material of the metal plates 32 can be selected freely without taking the heat radiation capability (coefficient of thermal conductivity, etc.) into account, the material of the metal plates 32, which is congenial to the resin, can be selected. Furthermore, by roughening the upper surfaces of the metal plates 32, adhesion between the metal plates 32 and the resin can be further increased.

It is noted that the upper surfaces of the metal plates 32 are basically roughened; however, if adhesion between the metal plates 32 and the resin can be ensured sufficiently by selecting the material congenial to the resin, the upper surfaces of the metal plates 32 need not be roughened.

Third Embodiment

In the third embodiment, a metal block 30B is shown in which concave portions, which have shapes different from those in the second embodiment, are provided in the plating area 30a. It is noted that in the third embodiment an explanation for the components which are the same as those in the previously described embodiments is omitted.

Figure 16:
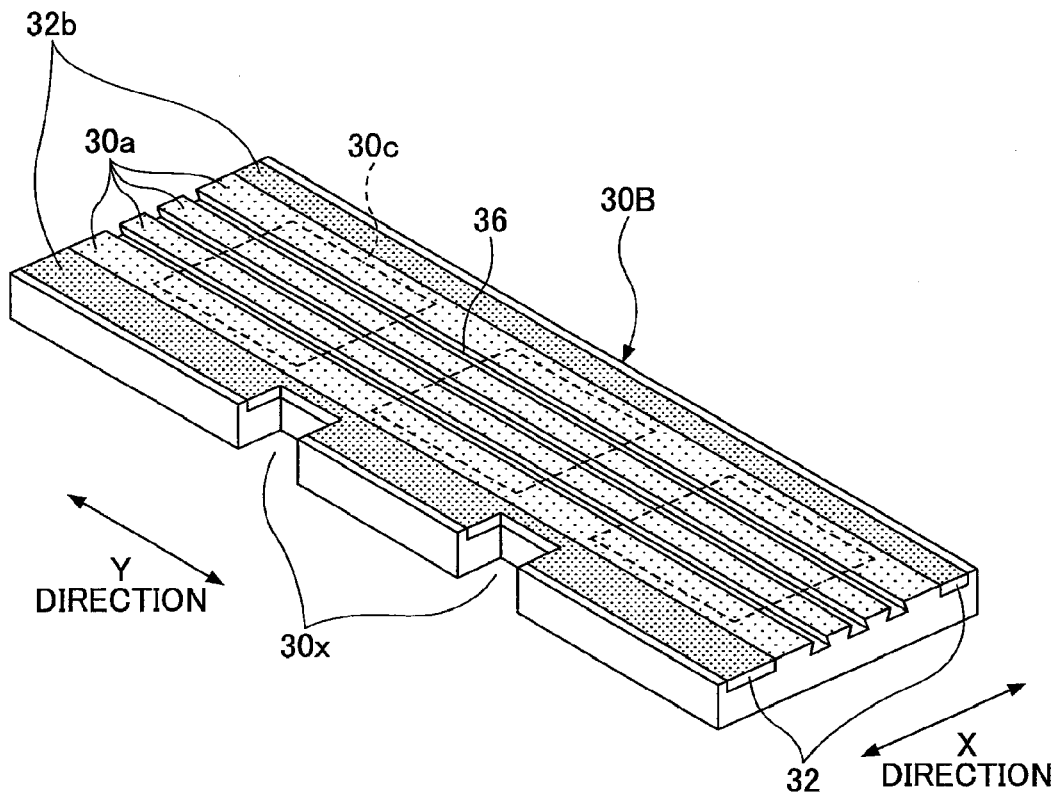
FIG. 16 is a perspective view for illustrating an example of a status in which the semiconductor devices 10 are not installed on a metal block 30B.
Figure 17:
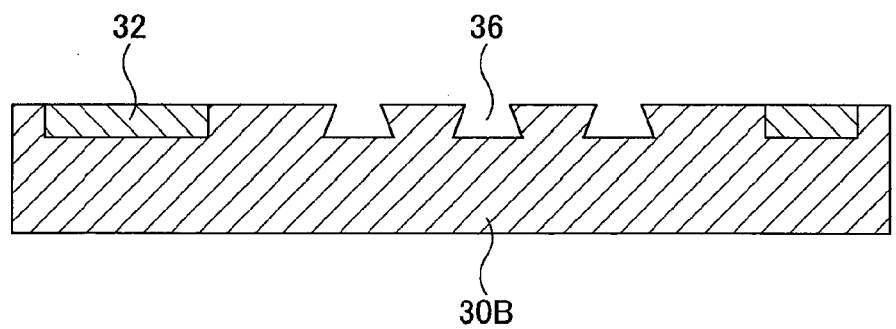
FIG. 17 is a cross-sectional view for illustrating an example of a status in which the semiconductor devices 10 are not installed on the metal block 30B.

FIG. 16 is a perspective view for illustrating an example of a status in which the semiconductor devices 10 are not installed on the metal block 30B. FIG. 17 is a cross-sectional view for illustrating an example of a status in which the semiconductor devices 10 are not installed on the metal block 30B. As shown in FIG. 16 and FIG. 17, the metal block 30B differs from the metal block 30A (see FIG. 15) in that the concave portions 35 are replaced with concave portions 36. In this way, the concave portions whose longitudinal direction corresponds to the Y direction may be arranged side by side in the Y direction.

The concave portion 36 has a shape of the cross section different from that of the concave portion 35. The concave portion 36 is formed such that the area of the opening portion is smaller than the area at the bottom (i.e., a reversed tapered shape), as is the case with the wedge portion 35a. As a result, when the resin molded portion 60 is formed such that it covers the semiconductor devices 10, the wiring members 20, 22 and the metal blocks 30B, resin material forming the resin molded portion 60, such as epoxy resin, is supplied and set in the concave portions 36. Thus, even if thermal stress is generated in such a direction that it peels off the resin molded portion 60 at an interface with the metal block 30B at the time of an operation of the semiconductor devices 10, etc., the resin filling in the concave portions 36 is not pulled out. Thus, it is possible to avoid peeling off the resin molded portion 60 at an interface with the plating area 30a of the metal block 30B, and thus ensure adhesion between the plating area 30a of the metal block 30B and the resin molded portion 60.

It is noted that the size of the opening of the concave portion 36 (in a plan view) may be a range from 0.2 mm to 0.5 mm. Further, the depth of the concave portion 36 may be 0.2 to 0.5 mm, for example.

The way of manufacturing the metal block 30B is substantially the same as that of the metal block 30A except that according to the way of manufacturing the metal block 30B the concave portions 36 are formed, concurrently with forming the strip-shaped concave portions into which the metal plates 32 are press-fitted, with a die in the winding direction (i.e., a longitudinal direction) of the hoop material 31.

Figure 18:
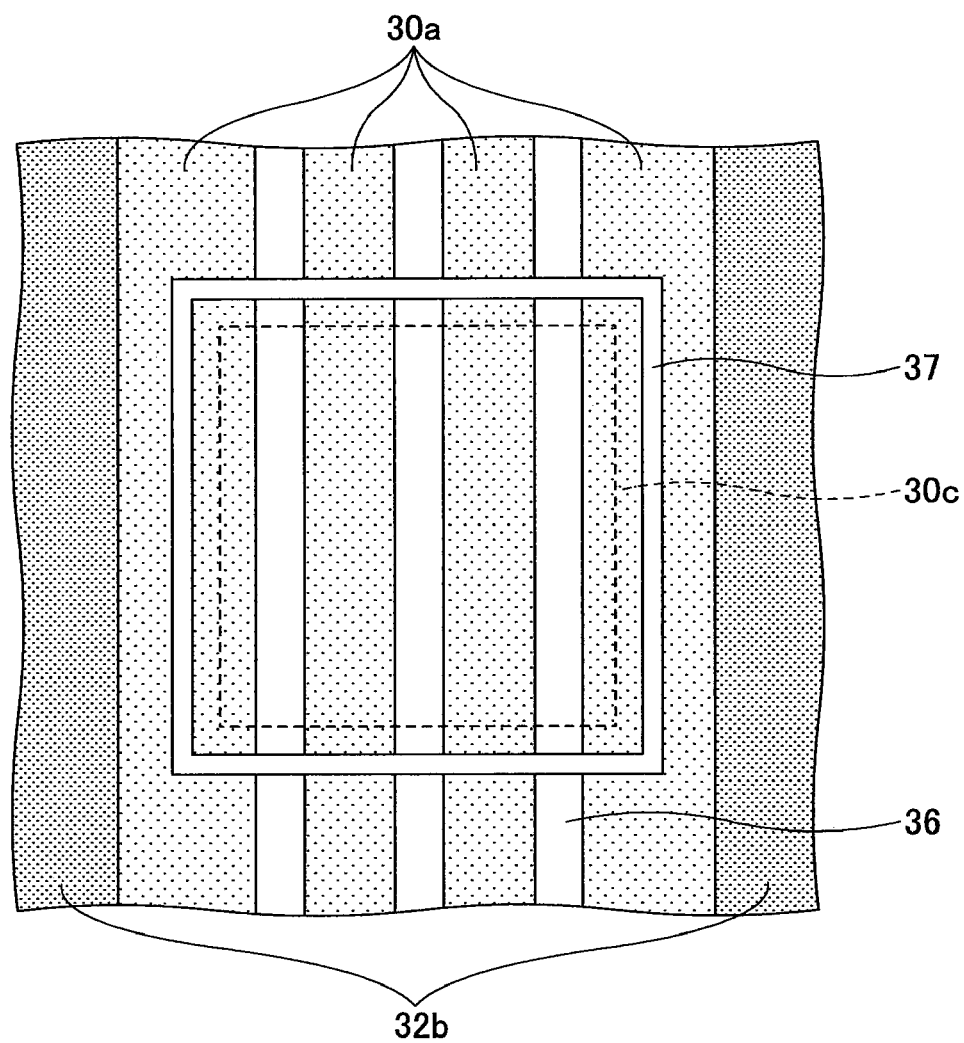
FIG. 18 is an enlarged plan view of an example of a concave portion 37.

It is noted that it is preferred to form a concave portion 37 which is frame-shaped in a plan view such that it surround the semiconductor device installation areas 30c, as shown in FIG. 18, in order to prevent melted soldering material, which forms the solder layers 82 when it cures, from flowing in the concave portions 36 while installing the semiconductor devices 10 on the semiconductor device installation areas 30c via the solder layers 82. Preferably, the depth of the concave portion 37 is greater than that of the concave portion 36. The concave portion 37 may be formed concurrently with the concave portions 36 when forming the strip-shaped concave portions, into which the metal plates 32 are press-fitted, with a die in the winding direction (i.e., a longitudinal direction) of the hoop material 31. In this way, since the concave portions 36 and 37 are formed concurrently in forming the strip-shaped concave portions into which the metal plates 32 are press-fitted, they are not factors that increase the manufacturing cost of the metal block 30B.

As described above, in the third embodiment, the concave portions whose longitudinal direction corresponds to the Y direction are formed in the plating area 30a and side by side in the Y direction. Even according to such an embodiment the same effects as those of the second embodiment can be obtained.

Fourth Embodiment

In the fourth embodiment, a metal block 30C is shown in which a plating area and roughened areas, which are different from those of the metal block 30 according to the first embodiment, are provided. It is noted that in the fourth embodiment an explanation for the components which are the same as those in the previously described embodiments is omitted.

Figure 19:
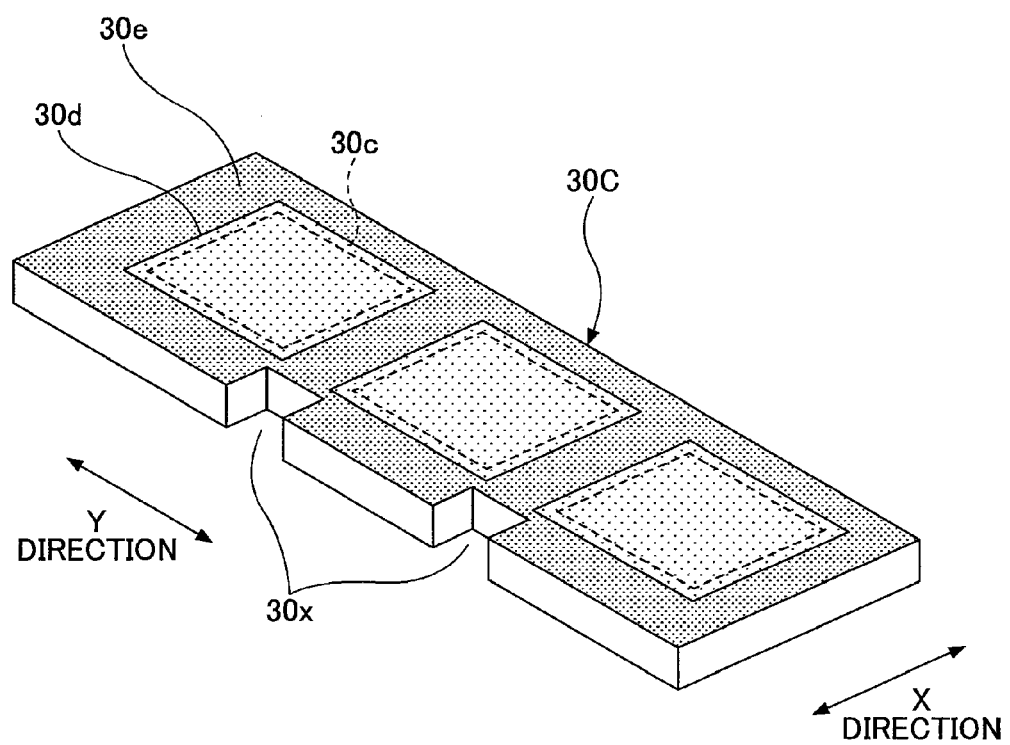
FIG. 19 is a perspective view for illustrating an example of a status in which the semiconductor devices 10 are not installed on a metal block 30C.

FIG. 19 is a perspective view for illustrating an example of a status in which the semiconductor devices 10 are not installed on the metal block 30C. As shown in FIG. 19, the upper surface of the metal block 30C is divided into plating areas 30d and a roughened area 30e. The plating areas 30d are formed such that they include the corresponding semiconductor device installation areas 30c which are located near the center in the upper surface of the metal block 30C. The roughened area 30e is formed in an area on the upper surface of the metal block 30C except for the plating areas 30d. Cut portions 30x are formed on a certain side of the metal block 30C. However, the cut portions 30x are used for registration, etc., and thus may be omitted.

The reason why the plating areas 30d are provided, a material and a thickness of the plating areas 30d, etc., are the same as those of the plating area 30a, and thus an explanation for them is omitted. Further, the reason why the roughened area 30e is provided, a way of forming the roughened area 30e, and a preferred surface roughness of the roughened area 30e are the same as those of the roughened area 30b, and thus an explanation for them is omitted.

In the case of the metal block 30C, unlike the metal block 30, the plating areas 30d and the roughened area 30e are not formed in a strip form along the Y direction. However, since the semiconductor device installation areas 30c are provided in the corresponding plating areas 30d, the same effects as is the case with the first embodiment, such as the increased solder wetability in installing the semiconductor devices 10 via the solder layers 82, etc., can be obtained. Further, since the roughened area 30e is formed in the area on the upper surface of the metal block 30C except for the plating areas 30d, the same effects as is the case with the first embodiment, such as increased adhesion between the metal block 30C and the resin molded portion 60, etc., can be obtained.

The plating areas 30d and the roughened area 30e can be manufactured in substantially the same manner as is the case with the plating area 30a and the roughened areas 30b except for the masking way. Specifically, since the plating areas 30d and the roughened area 30e are not formed in a strip form along the Y direction in the metal block 30C, it is not possible to adopt the way of applying the masking tape (the strip-shaped material) whose width corresponds to the width of the area to be masked in the plating process and the roughening process. Thus, it is necessary to coat the resist material and thus workability of masking is not good in comparison with the metal block 30. Thus, the metal block 30 is superior to the metal block 30C in terms of the manufacturing cost.

Fifth Embodiment

In the fifth embodiment, a hybrid system, which includes the semiconductor module 1 which includes the metal block 30 according to the first embodiment, the metal block 30A according to the second embodiment, the metal block 30B according to the third embodiment, or the metal block 30C according to the fourth embodiment, is shown. It is noted that in the fifth embodiment an explanation for the components which are the same as those in the previously described embodiments is omitted.

Figure 20:
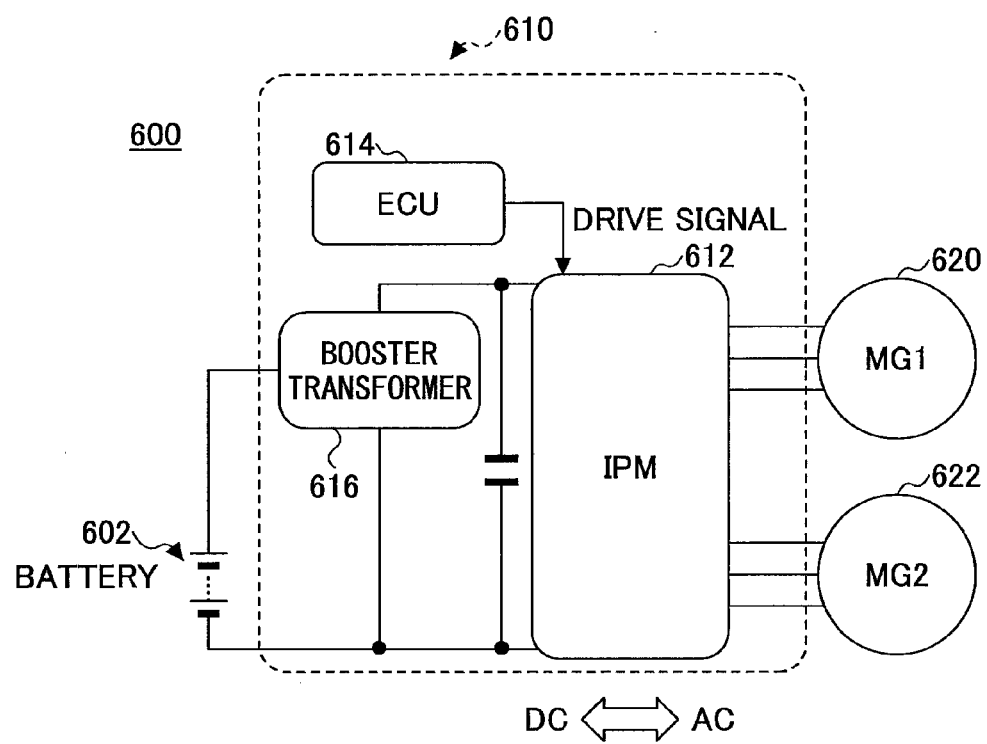
FIG. 20 is a diagram for schematically illustrating an example of a hybrid system 600 including the semiconductor module 1.

FIG. 20 is a diagram for schematically illustrating an example of the hybrid system 600 including the semiconductor module 1.

In the illustrated embodiment, the hybrid system 600 includes a battery 602, an inverter 610, and motor-generators 620, 622. The semiconductor module 1 may be implemented as an IPM (Intelligent Power Module) 612. The IPM 612 is installed in the inverter 610 and performs the transformation between direct current (DC) and alternating current (AC) by means of PWM control based on signals supplied from an ECU 614. It is noted that in the illustrated embodiment a DC-DC booster transformer 616 is added in the inverter 610.

The present invention is disclosed with reference to the preferred embodiments. However, it should be understood that the present invention is not limited to the above-described embodiments, and variations and modifications may be made without departing from the scope of the present invention.

For example, in the above-described embodiments, the semiconductor devices 10 are configured with a total of six arms of upper arms and lower arms wherein each arm includes U-phase, V-phase and W-phase. However, the number of the arms installed in the semiconductor module 1 may be any. If the semiconductor module 1 is embodied as an inverter for driving two motors, for example, the semiconductor devices 10 may be configured with the respective arm of the upper and lower arms of U-phase, V-phase and W-phase for the first motor and the respective arm of the upper and lower arms of U-phase, V-phase and W-phase for the second motor. Further, several semiconductor devices 10 may be installed in parallel for one arm.

Further, the semiconductor module 1 may include another configuration (parts of elements of a DC-DC booster transformer for driving a motor, for example), and the semiconductor module 1 may include another element (capacitor, inductor, etc.) in addition to the semiconductor devices 10. Further, the semiconductor module 1 may be any module as long as it requires cooling, and thus is not limited to the semiconductor module which implements the inverter. Further, the semiconductor module 1 may be implemented as an inverter used for applications (a train, an air conditioner, an elevator, a refrigerator, etc.) other than vehicle applications.

Further, in the above-described first embodiment, if the semiconductor modules 1 are arranged in the Y direction, the semiconductor modules 1 may be arranged in a staggered configuration such that two neighboring semiconductor modules 1 are offset to each other in the X direction. In other words, the semiconductor modules 1 may be arranged in the Y direction such that one of the mounting portions 52 of one of the two neighboring semiconductor modules 1 is included in space (concave area in the end in the Y direction) between the mounting portions 52 of the other of the two neighboring semiconductor modules 1. In this case, when more than two semiconductor modules 1 are installed such that they are aligned in the Y direction, it is possible to efficiently install them by utilizing reduced space in the Y direction. Thus, it is possible to save space in the Y direction (and thus downsize the module as a whole).

The present application is based on and claims priority from Japanese Patent Application No. JP2011-005961, filed on Jan. 14, 2011, the entire contents of which are hereby incorporated by reference.

The invention claimed is:

1. A semiconductor module comprising:
a metal block; a semiconductor device installed via a solder layer in a semiconductor device installation area on a surface of the metal block; and
a molded portion formed by molding a resin on the metal block and the semiconductor device;
a plating area includes a plurality of concave portions formed therein; and
a roughened area is provided around the plating area,
wherein the surface of the metal block includes a plating area and a roughened area, and the semiconductor device installation area is provided in the plating area.

2. The semiconductor module of claim 1, wherein the plating area is formed in a strip form with respect to the metal block.

3. The semiconductor module of claim 2, wherein the roughened area is formed in a strip form on opposite sides of the plating area.

4. The semiconductor module of claim 1, wherein the surface of the metal block include an upper surface of a metal plate, the metal plate being formed of a material different from that of the metal block and being press-fitted to a part of the metal block;
the upper surface of the metal plate is made be a roughened area; and
an area of the surface of the metal block except for the upper surface of the metal plate is made be the plating area.

5. The semiconductor module of claim 1, wherein a plurality of the semiconductor device installation areas are provided on the surface of the metal block.

6. A hybrid system including the semiconductor module of claim 1.

7. The semiconductor module of claim 1, wherein the concave portions are not formed in the semiconductor device installation area on the surface of the metal block.

* * * * *